(12) United States Patent
Huang et al.

(10) Patent No.: US 12,358,426 B2
(45) Date of Patent: Jul. 15, 2025

(54) LIGHT EMITTING DEVICE

(71) Applicant: InnoLux Corporation, Miao-Li County (TW)

(72) Inventors: Yu-Chia Huang, Miao-Li County (TW); Hong-Sheng Hsieh, Miao-Li County (TW); Tsung-Han Tsai, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 18/382,527

(22) Filed: Oct. 22, 2023

(65) Prior Publication Data

US 2024/0166124 A1 May 23, 2024

(30) Foreign Application Priority Data

Nov. 22, 2022 (CN) .......................... 202211466190.7

(51) Int. Cl.
*B60Q 3/12* (2017.01)
*B60Q 3/18* (2017.01)

(52) U.S. Cl.
CPC .................. *B60Q 3/12* (2017.02); *B60Q 3/18* (2017.02)

(58) Field of Classification Search
CPC ........ B60K 35/00–415; B60Q 3/12–18; B60R 11/00–0229; B60R 2011/0005; F21V 19/02; F21W 2107/10; F21Y 2115/10; F21Y 2115/30; G02F 1/1323; G09F 9/00–35; H01L 25/0756; H10H 20/855
See application file for complete search history.

(56) References Cited

U.S. PATENT DOCUMENTS

| 7,209,628 | B2 | 4/2007 | Winston |
| 10,627,670 | B2 * | 4/2020 | Robinson ............. G02B 27/288 |
| 2015/0062491 | A1 | 3/2015 | Sakuragi |
| 2021/0341769 | A1 | 11/2021 | Woodgate |

FOREIGN PATENT DOCUMENTS

| CN | 104995536 B | 6/2019 |
| CN | 217060711 U | 7/2022 |

* cited by examiner

*Primary Examiner* — Jason M Han
(74) *Attorney, Agent, or Firm* — Winston Hsu

(57) ABSTRACT

A light emitting device emitting an output light includes a light adjustment structure. A sub light is defined as the output light corresponding to an azimuth angle, a first value L1 is a sum of a luminance of the sub light corresponding to a polar angle from 115 to 125 degrees, a second value L2 is a sum of a luminance of the sub light corresponding to a polar angle from 95 to 105 degrees, a third value L3 is a sum of a luminance of the sub light corresponding to a polar angle from 75 to 85 degrees, a fourth value L4 is a sum of a luminance of the sub light corresponding to a polar angle from 55 to 65 degrees. The first value L1, the second value L2, the third value L3 and the fourth value L4 satisfy L3<L2, and 1.23≤(L1*L3)/(L2*L4)≤2.92.

16 Claims, 13 Drawing Sheets

LIGHT EMITTING DEVICE

BACKGROUND OF THE DISCLOSURE

1. Field of the Disclosure

The present disclosure relates to a light emitting device, and more particularly to a light emitting device including light adjustment structure.

2. Description of the Prior Art

The light emitting device can be used as a display device in vehicles or other suitable equipment. For example, the light emitting device can be applied to a vehicle as a vehicle display. However, the light emitted by the light emitting device disposed in the vehicle may interfere with certain users (such as the driver) of the vehicle, thereby causing safety problems. Therefore, to reduce the interference of light emitted from the light emitting device in the vehicle to the driver is one of the important issues in the present field.

SUMMARY OF THE DISCLOSURE

The present disclosure aims at providing a light emitting device.

In some embodiments, a light emitting device configured to emit an output light having a distribution of luminance is provided by the present disclosure. The light emitting device includes a light adjustment structure, wherein the output light is adjusted by the light adjustment structure. A sub light is defined as the output light corresponding to an azimuth angle. A first value L1 is a sum of a luminance of the sub light corresponding to a polar angle from 115 degrees to 125 degrees, a second value L2 is a sum of a luminance of the sub light corresponding to a polar angle from 95 degrees to 105 degrees, a third value L3 is a sum of a luminance of the sub light corresponding to a polar angle from 75 degrees to 85 degrees, a fourth value L4 is a sum of a luminance of the sub light corresponding to a polar angle from 55 degrees to 65 degrees, and the first value L1, the second value L2, the third value L3 and the fourth value L4 satisfy the following relations:

$L3 < L2$; and $1.23 \leq (L1*L3)/(L2*L4) \leq 2.92$.

In some embodiments, a light emitting device configured to emit an output light having a distribution of luminance is provided by the present disclosure. The light emitting device includes a light adjustment structure, wherein the output light is adjusted by the light adjustment structure. A sub light is defined as the output light corresponding to an azimuth angle, a first value L1 is a sum of a luminance of the sub light corresponding to a polar angle from 125 degrees to 135 degrees, a second value L2 is a sum of a luminance of the sub light corresponding to a polar angle from 95 degrees to 105 degrees, a third value L3 is a sum of a luminance of the sub light corresponding to a polar angle from 75 degrees to 85 degrees, a fourth value L4 is a sum of a luminance of the sub light corresponding to a polar angle from 45 degrees to 55 degrees, and the first value L1, the second value L2, the third value L3 and the fourth value L4 satisfy the following relations:

$L3 < L2$; and $1.1 \leq (L2*L4)/(L1*L3)$.

In some embodiments, a light emitting device disposed in front of a front seat of a vehicle and emitting an output light having a distribution of luminance is provided by the present disclosure. The light emitting device includes a light adjustment structure, wherein the output light is adjusted by the light adjustment structure. A sub light is defined as the output light corresponding to an azimuth angle, a maximum luminance of the sub light is corresponding to a maximum luminance polar angle, and the maximum luminance polar angle is greater than or equal to 91 degrees and less than or equal to 105 degrees. The azimuth angle is 180 degrees for a left-hand drive vehicle, and the azimuth angle is 0 degree for a right-hand drive vehicle.

These and other objectives of the present disclosure will no doubt become obvious to those of ordinary skill in the art after reading the following detailed description of the embodiment that is illustrated in the various figures and drawings.

DETAILED DESCRIPTION

Figure 1:
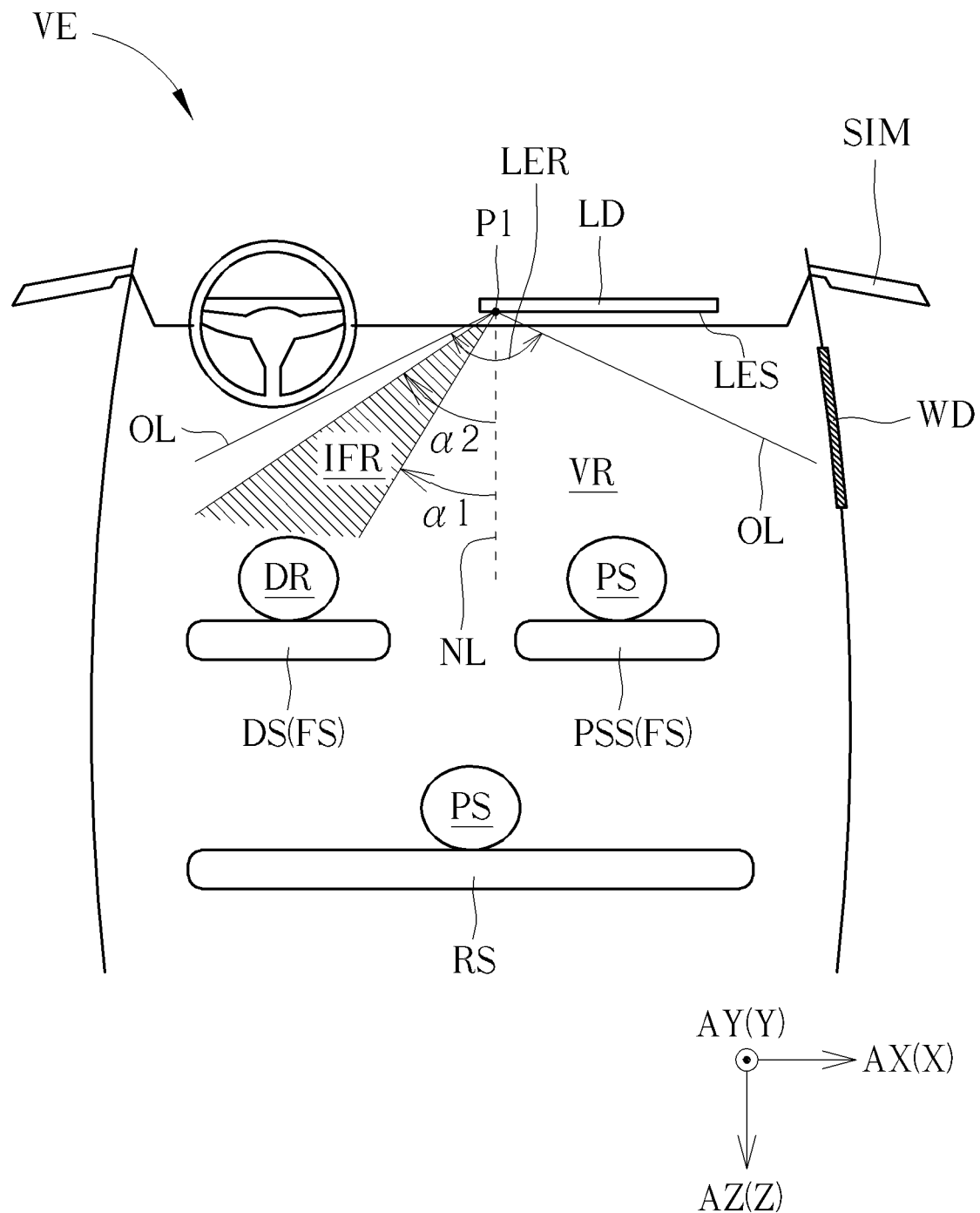
FIG. 1 schematically illustrates a top view showing an electronic device disposed in transportation according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the electronic device, and certain elements in various drawings may not be drawn to scale. In addition, the number and dimension of each element shown in drawings are only illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function.

In the following description and in the claims, the terms "include", "comprise" and "have" are used in an open-ended fashion, and thus should be interpreted to mean "include, but not limited to . . . ".

It will be understood that when an element or layer is referred to as being "disposed on" or "connected to" another element or layer, it can be directly on or directly connected to the other element or layer, or intervening elements or layers may be presented (indirectly). In contrast, when an element is referred to as being "directly on" or "directly connected to" another element or layer, there are no intervening elements or layers presented. When an element or a layer is referred to as being "electrically connected" to another element or layer, it can be a direct electrical connection or an indirect electrical connection. The electrical connection or coupling described in the present disclosure may refer to a direct connection or an indirect connection. In the case of a direct connection, the ends of the elements on two circuits are directly connected or connected to each other by a conductor segment. In the case of an indirect connection, switches, diodes, capacitors, inductors, resistors, other suitable elements or combinations of the above elements may be included between the ends of the elements on two circuits, but not limited thereto.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

In the present disclosure, the thickness, length and width may be measured through optical microscope, and the thickness or width may be measured through the cross-sectional view in the electron microscope, but not limited thereto.

In addition, any two values or directions used for comparison may have certain errors. In addition, the terms "equal to", "equal", "the same", "approximately" or "substantially" are generally interpreted as being within ±20%, ±10%, ±5%, ±3%, ±2%, ±1%, or ±0.5% of the given value.

In addition, the terms "the given range is from a first value to a second value" or "the given range is located between a first value and a second value" represents that the given range includes the first value, the second value and other values there between.

If a first direction is said to be perpendicular to a second direction, the included angle between the first direction and the second direction may be located between 80 to 100 degrees. If a first direction is said to be parallel to a second direction, the included angle between the first direction and the second direction may be located between 0 to 10 degrees.

Unless it is additionally defined, all terms (including technical and scientific terms) used herein have the same meaning as commonly understood by those ordinary skilled in the art. It can be understood that these terms that are defined in commonly used dictionaries should be interpreted as having meanings consistent with the relevant art and the background or content of the present disclosure, and should not be interpreted in an idealized or overly formal manner, unless it is specifically defined in the embodiments of the present disclosure.

It should be noted that the technical features in different embodiments described in the following can be replaced, recombined, or mixed with one another to constitute another embodiment without departing from the spirit of the present disclosure.

The electronic device of the present disclosure may include a display device, a sensing device, a back-light device, an antenna device, a tiled device or other suitable electronic devices, but not limited thereto. The electronic device may be a foldable electronic device, a flexible electronic device or a stretchable electronic device. The light emitting device may include the display device, and the display device may for example be applied to laptops, common displays, tiled displays, vehicle displays, touch displays, televisions, monitors, smart phones, tablets, light source modules, lighting devices or electronic devices applied to the products mentioned above, but not limited thereto. The display device may for example include liquid crystal, light emitting diodes, fluorescent material, phosphor material, other suitable display mediums, or combinations of the above-mentioned materials, but not limited thereto. The light emitting diode may for example include organic light emitting diode (OLED) or inorganic light emitting diode. The inorganic light emitting diode may for example include mini light emitting diode (mini LED), micro light emitting diode (micro LED), quantum dot light emitting diode (QLED or QDLED), other suitable materials or combinations of the above-mentioned materials, but not limited thereto. The sensing device may include a biosensor, a touch sensor, a fingerprint sensor, other suitable sensors or combinations of the above-mentioned sensors. The antenna device may for example include a liquid crystal antenna device, but not limited thereto. The tiled device may for example include a tiled display device or a tiled antenna device, but not limited thereto. The outline of the electronic device may be a rectangle, a circle, a polygon, a shape with curved edge or other suitable shapes. It should be noted that the electronic device of the present disclosure may be combinations of the above-mentioned devices, but not limited thereto. The light emitting device is taken as an example of the electronic device to describe the present disclosure in the following, but the present disclosure is not limited thereto.

The light emitting device of the present disclosure may be applied to various devices as the display device. In some embodiments, the light emitting device may be used in transportations such as vehicles, ships, airplanes, and the like, as the display device in the transportations. The light emitting device disposed in a vehicle as a vehicle display is taken as an example for describing the contents of the present disclosure in the following, but the present disclosure is not limited thereto.

Referring to FIG. 1, FIG. 1 schematically illustrates a top view showing an electronic device disposed in transportation according to a first embodiment of the present disclosure, wherein the transportation may for example be a left-handed vehicle, but not limited thereto. The electronic device of the present embodiment includes a light emitting device LD, wherein the light emitting device LD may be a display device disposed in the transportation VE as the vehicle display. The light emitting device LD may be disposed in front of the front seat FS of the transportation VE, for example, in front of the passenger seat PSS, but not limited thereto. The light emitting device LD may include a self-luminous display device or a non-self-luminous display device. The self-luminous display device may for example include light emitting diodes, but not limited thereto. The non-self-luminous display device may for example include a liquid crystal display device, but not limited thereto. The detailed structure of the light emitting device LD will be detailed in the following.

The light emitting device LD may have a light emitting surface LES, wherein the light emitting surface LES may face the front seat FS of the transportation VE. The output light emitted by the light emitting device LD may be emitted from the light emitting surface LES. When the light emitting device LD is a display device, images may thereby be displayed. In other words, the light emitting surface LES may serve as the display surface of the light emitting device LD.

According to the present embodiment, a direction X, a direction Y and a direction Z may be defined in the space of the transportation VE. The direction X may be defined as the direction from the left side to the right side of the transportation VE (or from the driver's seat DS to the passenger seat PSS), and a direction –X is opposite to the direction X (that is, from the right side to the left side of the transportation VE). The direction Y may be defined as the direction from the bottom side to the top side of the transportation VE, and a direction –Y is opposite to the direction Y (that is, from the topside to the bottom side of the transportation VE). The direction Z may be defined as the direction from the front side to the rear side of the transportation VE (or from the front seat FS to the rear seat RS), and a direction –Z is opposite to the direction Z (that is, from the rear side to the front side of the transportation VE). According to the above-mentioned definitions, the light emitting surface LES of the light emitting device LD may for example be parallel to the direction X and the direction Y, or be parallel to a plane composed of the direction X and the direction Y, but not limited thereto. The definitions of the above-mentioned directions may be applied to each of the embodiments of the present disclosure, and will not be redundantly described.

As shown in FIG. 1, an output light OL may be emitted by the light emitting device LD, wherein the output light OL may be emitted from the light emitting surface LES and form a light emitting region LER. The range of the light emitting region LER shown in FIG. 1 is just exemplary, and the present embodiment is not limited thereto. In the present embodiment, the user may observe the output light OL at an angle of view, wherein the angle of view may be the included angle between a connection line between the user and an output point P1 of the output light OL on the light emitting surface LES and a normal line NL of the light emitting surface LES, wherein the normal line NL in FIG. 1 is drawn to extend from the output point P1. The extending direction of the normal line NL may be the normal direction of the light emitting surface LES and parallel to the direction Z. Therefore, the direction Z may be the normal direction of the light emitting surface LES. Therefore, when the user observes the output light OL at the normal line NL, the angle of view may be 0 degree. In addition, in the present embodiment, the angle of view from the normal line NL toward the direction –X (that is, in the left side of the normal line NL) may be defined as negative, and the angle of view from the normal line NL toward the direction X (that is, in the right side of the normal line NL) may be defined as positive. The definition of "angle of view" mentioned in the following may refer to the above-mentioned contents.

According to the present embodiment, the light emitting region LER of the output light OL may include a first region IFR and a second region VR other than the first region IFR. The first region IFR may be defined as a region in the light emitting region LER that can be observed by specific user(s). In other words, the light in the first region IFR may be perceived by the specific user (s). The second region VR may be the region in the light emitting region LER corresponding to other users except for the specific user(s), such as the passenger PS, but not limited thereto. In some embodiments, the second region VR may be the region in the light emitting region LER other than the first region IFR. The "specific user" mentioned above may be the at least one of the users (for example, including the driver DR and the passengers PS) on whom the influence of the light of the light emitting device LD is expected to be reduced. For example, the specific user in the transportation VE may be driver DR, but not limited thereto. As shown in FIG. 1, the angle of view at which the driver DR observes the output light OL may for example range from the angle of view α1 to the angle of view α2, and the first region IFR may be defined as the region in the light emitting region LER between the angle of view α1 and the angle of view α2. In some embodiments, the first region IFR may be the region in the light emitting region LER between the angle of view of –25 degrees and the angle of view of –35 degrees, that is, the angle of view α1 is –25 degrees, and the angle of view α2 is –35 degrees, but not limited thereto. In some embodiments, the first region IFR may be the region in the light emitting region LER between the angle of view of –35 degrees and the angle of view of –45 degrees, that is, the angle of view α1 is –35 degrees, and the angle of view α2 is –45 degrees, but not limited thereto. In some embodiments, the second region VR may be defined as the region in the light emitting region LER at an angle of view greater than the angle of view α1 and/or the region in the light emitting region LER at an angle of view less than the angle of view α2. It should be noted that the light emitting device LD may further include other output light emitted from any suitable position on the light emitting surface LES, and is not limited to the output light OL shown in FIG. 1.

It should be noted that the disposition position of the light emitting device LD of the present embodiment in the transportation VE is not limited to what is shown in FIG. 1. In some embodiments, the light emitting device LD may be disposed at any suitable position in the transportation VE, and the range of the first area IFR can be defined according to the position of the specific user(s) (such as the driver). In some embodiments, the light emitting device LD may be disposed in other suitable transportation (such as ships or airplanes, but not limited thereto), and the range of the first area IFR can be defined according to the position of the specific user(s). In some embodiments, the specific user(s) may be more than one.

Figure 2:
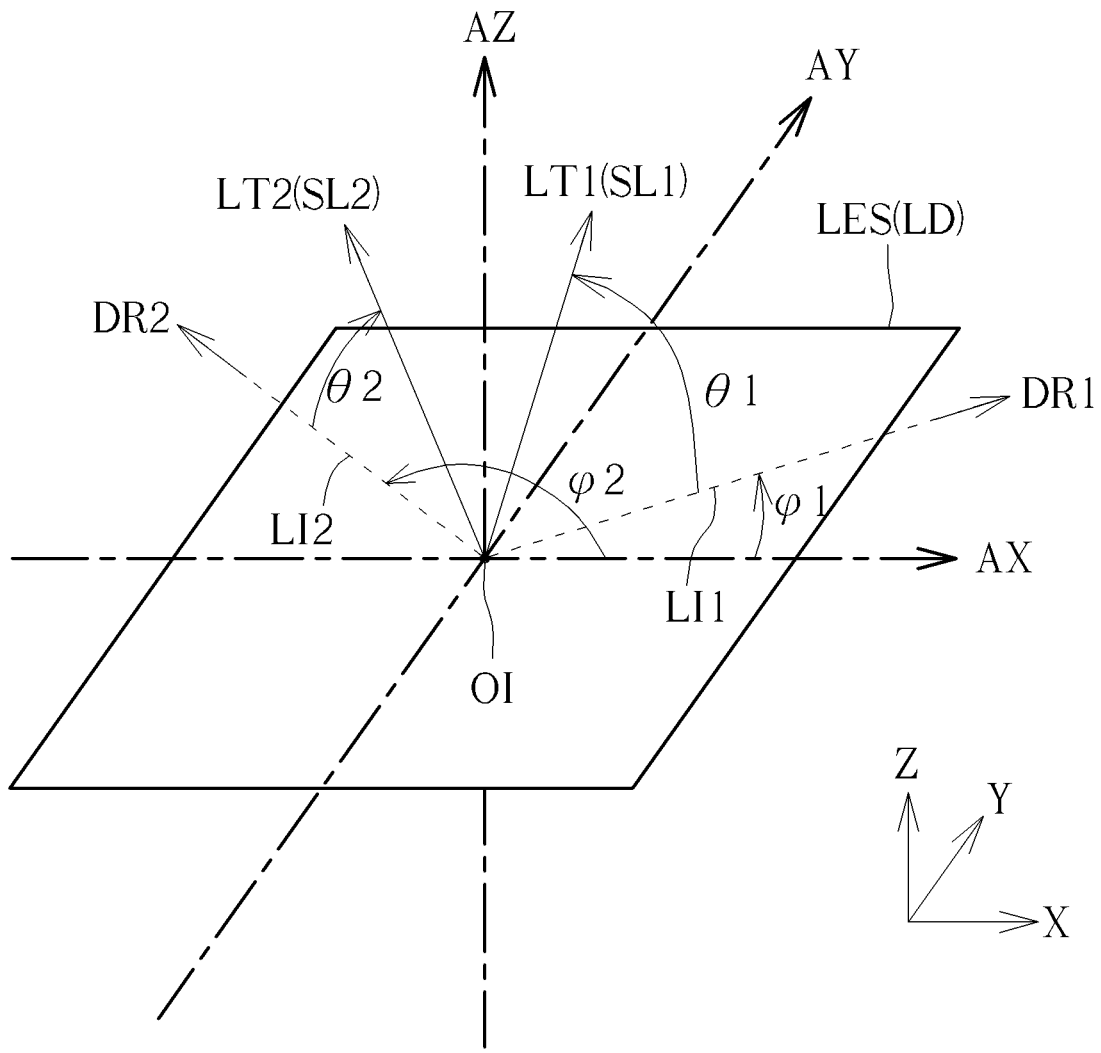
FIG. 2 schematically illustrates a light emitting surface of the electronic device according to the first embodiment of the present disclosure in a coordinate system.

Referring to FIG. 2 and FIG. 1, FIG. 2 schematically illustrates a light emitting surface of the electronic device according to the first embodiment of the present disclosure in a coordinate system. Specifically, the coordinate system shown in FIG. 2 may be composed of a horizontal axis AX, a vertical axis AY and a normal axis AZ of the light emitting device LD, but not limited thereto. Combining FIG. 1 and FIG. 2, the positive direction of the horizontal axis AX may be defined as the direction from the left side to the right side of the transportation VE, wherein the horizontal axis AX may be parallel to the direction from the driver's seat DS to the passenger seat PSS, that is, the direction X; the positive direction of the vertical axis AY may be defined as the direction from the bottom side to the top side of the transportation VE, wherein the vertical axis AY may be parallel to the direction Y; the positive direction of the normal axis AZ may be defined as the direction from the front side to the rear side of the transportation VE, wherein the normal axis AZ may be parallel to the direction from the front seat FS to the rear seat RS, that is, the direction Z. The definitions of the horizontal axis AX, the vertical axis AY and the normal axis AZ mentioned in the following may refer to the contents mentioned above, and will not be redundantly described. As shown in FIG. 2, the horizontal axis AX and the vertical axis AY may extend on the light emitting surface LES of the light emitting device LD, that is, the light emitting surface LES may coincide the plane composed of the horizontal axis AX and the vertical axis AY (hereinafter referred as the plane XY). In addition, the normal axis AZ may be perpendicular to the light emitting surface LES, or in other words, the normal axis AZ may be parallel to the normal direction (that is, the direction Z) of the light emitting surface LES.

According to the present embodiment, in the three-dimensional coordinate system shown in FIG. 2, the plane XY composed of the horizontal axis AX and the vertical axis AY may pass through an origin OI, an azimuth angle (such as the azimuth angle φ1 and the azimuth angle φ2) may be defined as the included angle on the plane XY and between any virtual line extending from the origin OI and the positive horizontal axis AX (that is, the horizontal axis AX at the right side of the origin OI), that is, the azimuth angle may be the included angle on the plane XY starting from the positive horizontal axis AX to the above-mentioned virtual line extending from the origin OI along a counterclockwise direction. According to the above-mentioned definition, the azimuth angle may be the angle on the plane XY (that is, the light emitting surface LES). Therefore, the azimuth angle may be greater than or equal to 0 degree and less than 360 degrees (that is, 0°≤azimuth angle<360°). In addition, in the present embodiment, an azimuth angle may have a direction, wherein the direction may be the extending direction of the virtual line extending from the origin OI that determine the azimuth angle on the plane XY. For example, as shown in FIG. 2, the azimuth angle φ1 may be the included angle starting from the positive horizontal axis AX to the virtual line LI1 passing through the origin OI, and the direction of the azimuth angle φ1 may be the extending direction of the virtual line LI1 starting from the origin OI, that is, the direction DR1; the azimuth angle φ2 may be the included angle starting from the positive horizontal axis AX to the virtual line LI2 passing through the origin OI, and the direction of the azimuth angle φ2 may be the extending direction of the virtual line LI2 starting from the origin OI, that is, the direction DR2. In the present embodiment, the directions of different azimuth angles are different.

According to the present embodiment, the light emitting device LD may emit output light (such as the output light OL shown in FIG. 1) from any position of the light emitting surface LES, wherein a sub light is defined as the output light corresponding to an azimuth angle. In the coordinate system shown in FIG. 2, the output light may be emitted from the origin OI of the light emitting surface LES. Specifically, a sub light may be a portion of the output light corresponding to an azimuth angle, and the sub light would be distributed on a plane perpendicular to the plane XY. Therefore, a projection of the sub light corresponding to an azimuth angle on the plane XY may be parallel to the direction of the azimuth angle (including the positive direction and the negative direction). In other words, a portion of a projection of an output light on the plane XY which is parallel to the direction of an azimuth angle may be defined as the sub light of the output light corresponding to the azimuth angle. For example, as shown in FIG. 2, the sub light SL1 may be defined as the portion of the output light corresponding to the azimuth angle φ1. Similarly, the sub light SL2 may be defined as the portion of the output light corresponding to the azimuth angle φ2. It should be noted that FIG. 2 just exemplarily shows a portion (such as the light LT1) of the sub light SL1 and a portion (such as the light LT2) of the sub light SL2, and the sub light SL1 and the sub light SL2 may respectively include all of the light in the output light corresponding to the azimuth angle φ1 and all of the light in the output light corresponding to the azimuth angle φ2.

According to the present embodiment, a sub light defined as the output light corresponding to an azimuth angle may have a luminance variation with a polar angle, wherein the polar angle may be the included angle between any portion of the sub light and the direction of the azimuth angle in the direction of the azimuth angle. Specifically, in a sub light defined as the output light corresponding to an azimuth angle, a polar angle of the sub light can be defined as the included angle starting from the direction of the azimuth angle to any portion of the sub light. For example, as shown in FIG. 2, in the sub light SL1 corresponding to the azimuth angle φ1, the light LT1 may be the portion of the sub light SL1 with a polar angle θ1, wherein the polar angle θ1 is the included angle starting from the direction DR1 of the azimuth angle φ1 to the light LT1; in the sub light SL2 corresponding to the azimuth angle φ2, the light LT2 may be the portion of the sub light SL2 with a polar angle θ2, wherein the polar angle θ2 is the included angle starting from the direction DR2 of the azimuth angle φ2 to the light LT2, but not limited thereto. As shown in FIG. 2, the polar angle may be greater than or equal to 0 degree and less than or equal to 180 degrees (that is, 0°≤polar angle≤180°).

According to the present embodiment, combining FIG. 1 and FIG. 2, the polar angle in an azimuth angle shown in FIG. 2 can be converted into the angle of view shown in FIG. 1. Similarly, the angle of view can be converted into the polar angle. For example, when the sub light is defined as the output light corresponding to the azimuth angle of 180 degrees, the polar angle shown in FIG. 2 from 0 degree to 180 degrees may correspond to the angle of view shown in FIG. 1 from −90 degrees to 90 degrees. Similarly, when the sub light is defined as the output light corresponding to the azimuth angle of 0 degree, the polar angle from 0 degree to 180 degrees may correspond to the angle of view shown from 90 degrees to −90 degrees.

Generally, in the present embodiment, a sub light of the output light may be defined through an azimuth angle, and the sub light has a luminance distribution with a polar angle. The definitions and features of the azimuth angle and polar angle mentioned above can be applied to each of the embodiments of the present disclosure.

According to the present embodiment, the output light emitted from the light emitting surface LES may have a distribution of luminance, that is, a distribution light intensity. In the present embodiment, the distribution of luminance of the sub light defined as the output light corresponding to any azimuth angle with a polar angle can be measured through any suitable instrument. In detail, a measuring point can be selected on the light emitting surface LES of the light emitting device LD, wherein the measuring point may be located at the origin OI in the coordinate system shown in FIG. 2. After that, a luminance measuring instrument (for example, angle measuring instrument, integral optical measuring instrument or other suitable instrument) may be disposed corresponding to the direction of an azimuth angle (or it can be said that the luminance measuring instrument is disposed in the direction of the azimuth angle), and the included angle (that is, the polar angle) between the connection line between the luminance measuring instrument and the origin OI and the direction of the azimuth angle can be adjusted, wherein the optical receiving element in the luminance measuring instrument may aim at the measuring point (that is, the origin OI), thereby obtaining the distribution of luminance of the sub light defined as the output light corresponding to the azimuth angle with the polar angle. For example, in order to measure the distribution of luminance of the sub light defined as the output light corresponding to the azimuth angle φ1 with the polar angle (shown as the label θ1 in FIG. 2), the luminance measuring instrument may be disposed corresponding to the direction DR1 of the azimuth angle φ1, and the included angle between the connection line between the luminance measuring instrument and the origin OI and the direction DR1 in the direction DR1 can be adjusted, such that the distribution of luminance of the sub light defined as the output light corresponding to the azimuth angle φ1 with the polar angle may be obtained. The distribution of luminance of the sub light defined as the output light corresponding to the azimuth angle φ2 with the polar angle may be measured in similar way, and will not be redundantly described. In should be noted that the measuring way mentioned above is exemplary, and the present embodiment is not limited thereto. In some embodiments, the distribution of luminance of the sub light defined as the output light corresponding to an azimuth angle with the polar angle may be measured through multiple measuring points (such as five, seven or nine measuring points, but not limited thereto) on the light emitting surface LES, and the distribution of luminance of the sub light defined as the output light corresponding to the azimuth angle with the polar angle may be defined through the average of the results obtained from the multiple measuring points or through other suitable calculation of the results obtained from the multiple measuring points. In the present embodiment, the distribution of luminance of the sub lights defined as the output light corresponding to different azimuth angles with the polar angle may be the same or different. The measuring point(s) may for example be selected on the light emitting surface LES of the light emitting device LD. When the light emitting device LD is a display device, it may have a display region, wherein the display region may be defined through the light emitting units (such as the light emitting units LU shown in FIG. 7) of the light emitting device LD. For example, the display region may be defined as the region enclosed by the outlines of the outermost light emitting units, but not limited thereto. For example, the measuring point(s) may be selected near the edge of the display region of the light emitting device LD close to the driver DR, wherein the measuring point(s) is located in the display region, and the distance between the measuring point(s) and the edge of the display region may be between 1 centimeter (cm) to 10 cm, but not limited thereto.

Figure 3:
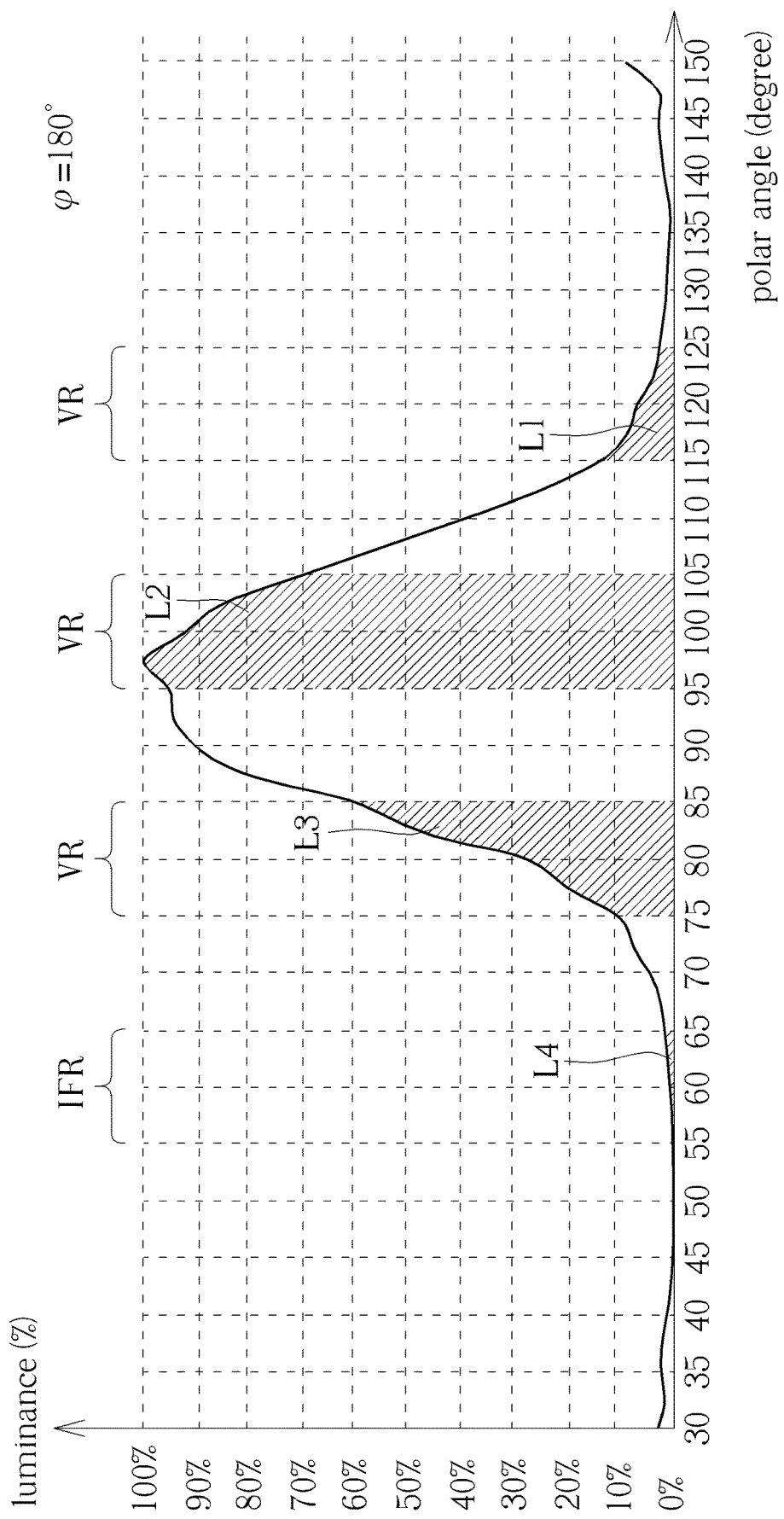
FIG. 3 schematically illustrates a relation between luminance and polar angle of a sub light defined as an output light of the electronic device corresponding to an azimuth angle according to the first embodiment of the present disclosure.

Referring to FIG. 3 as well as FIG. 1 and FIG. 2, FIG. 3 schematically illustrates a relation between luminance and polar angle of a sub light defined as an output light of the electronic device corresponding to an azimuth angle according to the first embodiment of the present disclosure. FIG. 3 shows the distribution of luminance of the sub light defined as the output light corresponding to an azimuth angle with the polar angle, wherein the output light is emitted from the light emitting device including a light adjustment structure of the present disclosure. The luminance in the vertical axis shown in FIG. 3 may be the normalized luminance, wherein the maximum luminance is 100%. According to the present embodiment, the light emitting device LD may have a light adjustment structure (not shown), wherein the light adjustment structure may include any element and/or layer capable of adjusting light path. The detailed structure of the light adjustment structure will be detailed in the following and may refer to the structures shown in FIG. 7 to FIG. 13. By making the light emitting device LD including the light adjustment structure, the output light can be adjusted by the light adjustment structure, such that the distribution of luminance of the sub light defined as the output light corresponding to an azimuth angle with the polar angle is changed.

As shown in FIG. 1, the transportation VE may be left-handed in the present embodiment, and the light emitting device LD may be disposed in front of the passenger seat PSS. In other words, the driver DR may be located at the left side of the light emitting device LD, or the driver DR may be located in the direction −X with respect to the light emitting device LD. In such condition, the driver DR may be located in the direction of the light emitting surface LES corresponding to the azimuth angle of 180 degrees. Therefore, in order to reduce the influence of the output light of the light emitting device LD on the driver DR, the distribution of luminance of the sub light defined as the output light corresponding to the azimuth angle of 180 degrees may be adjusted in the present embodiment. In other words, the direction of the selected azimuth angle may be parallel to the horizontal axis AX of the light emitting device LD, wherein the horizontal axis AX may be parallel to the direction X.

In some embodiments, when the transportation VE is right-handed, the light emitting device LD may be located at the left side of the driver DR, or the driver DR may be located in the direction X with respect to the light emitting device LD. In such condition, the driver DR may be located in the direction of the light emitting surface LES corresponding to the azimuth angle of 0 degree. Therefore, in order to reduce the influence of the output light of the light emitting device on the driver, the distribution of luminance of the sub light defined as the output light corresponding to the azimuth angle of 0 degree may be adjusted.

It should be noted that the light emitting device LD may have at least two viewing modes, such as the wide viewing angle mode and the narrow viewing angle mode, wherein these viewing modes are switchable. In the present disclosure, the distribution of luminance of the sub light defined as the output light corresponding to an azimuth angle mentioned in the following may be the design in one of the viewing modes, such as the narrow viewing angle mode, but not limited thereto.

FIG. 3 shows the distribution of luminance of the sub light defined as the output light corresponding to the azimuth angle of 180 degrees of the light emitting surface LES with the polar angle from 30 degrees to 150 degrees when the light emitting device LD is disposed in a left-handed transportation VE. According to the conversion method of polar angle and angle of view in the azimuth angle of 180 degrees mentioned above, the polar angle of 30 degrees may correspond to the angle of view of −60 degrees, and the polar angle of 150 degrees may correspond to the angle of view of 60 degrees. It should be note that the distribution of luminance of the sub light defined as the output light corresponding to the azimuth angle of 180 degrees with the polar angle from 0 degree to 180 degrees may be the same as the distribution of luminance of the sub light defined as the output light corresponding to the azimuth angle of 0 degree with the polar angle from 180 degrees to 0 degree. As mentioned above, since the first region IFR may be the region in the light emitting region LER corresponding to the angle of view from −35 degrees to −25 degrees, the portion of the sub light defined as the output light corresponding to the azimuth angle of 180 degrees at the polar angle from 55 degrees to 65 degrees may be the light in the first region IFR.

According to the present embodiment, in the distribution of luminance shown in FIG. 3, a first value L1 is a sum of a luminance of the sub light corresponding to a polar angle from 115 degrees to 125 degrees, a second value L2 is a sum of a luminance of the sub light corresponding to a polar angle from 95 degrees to 105 degrees, a third value L3 is a sum of a luminance of the sub light corresponding to a polar angle from 75 degrees to 85 degrees, and a fourth value L4 is a sum of a luminance of the sub light corresponding to a polar angle from 55 degrees to 65 degrees. In detail, the first value L1 may be defined as the integral of luminance of the sub light from the polar angle of 115 degrees to 125 degrees. The definition of the second value L2, the third value L3 and the fourth value L4 may refer to the definition of the first value L1, and will not be redundantly described. Taking the angle of view of 0 degree (corresponding to the polar angle of 90 degrees) as the baseline, the first value L1 may be the sum of luminance of the sub light at the angel of view from 25 degrees to 35 degrees, the second value L2 may be the sum of luminance of the sub light at the angel of view from 5 degrees to 15 degrees, the third value L3 may be the sum of luminance of the sub light at the angel of view from −5 degrees to −15 degrees, and the fourth value L4 may be the sum of luminance of the sub light at the angel of view from −25 degrees to −35 degrees. The "baseline" mentioned in the following may refer to the above-mentioned contents, and will not be redundantly described. In other words, the first value L1 and the fourth value L4 may be respectively defined at two sides of the baseline with a difference of 25 degrees to 35 degrees from the baseline, and the second value L2 and the third value L3 may be respectively defined at two sides of the baseline with a difference of 5 degrees to 15 degrees from the baseline. Therefore, the first value L1 and the fourth value L4 may be referred as the values at two sides symmetrical to the baseline, and the second value L2 and the third value L3 may be referred as the values at two sides symmetrical to the baseline. As mentioned above, since the portion of the sub light at the polar angle from 55 degrees to 65 degrees may be the light in the first region IFR, the light for defining the fourth value L4 may be the light in the first region IFR, and the light for defining the second value L2, the third value L3 and the first value L1 may be the light in the second region VR. The fourth value L4 may for example be the sum of luminance of the light in the first region IFR, but not limited thereto. It should be noted that the range of the second region VR is not limited to what is shown in FIG. 3, and the second region VR may further include the regions corresponding to other polar angles.

In the present embodiment, a first difference ratio may be defined as the ratio of the first value L1 to the fourth value L4 (that is, L1/L4), and a second difference ratio may be defined as the ratio of the second value L2 to the third value L3 (that is, L2/L3). After the first difference ratio and the second difference ratio are defined, the ratio of the first difference ratio to the second difference ratio may be defined as a third difference ratio. That is, the third difference ratio may be represented as (L1*L3)/(L2*L4). According to the present embodiment, the first value L1, the second value L2, the third value L3 and the fourth value L4 may satisfy the following relations:

$$L3 < L2; \text{ and}$$

$$1.23 \leq (L1*L3)/(L2*L4) \leq 2.92.$$

In other words, the third difference ratio may range from 1.23 to 2.92 (that is, 1.23≤third difference ratio≤2.92).

Specifically, the light emitting device LD of the present embodiment may have the light adjustment structure to adjust light path, such that the luminance of light at the angles of view respectively at two symmetrical sides of the baseline may be different, wherein the luminance of light at the angle of view at the right side of the baseline (that is, the angle of view is greater than 0 degree, or the polar angle is greater than 90 degrees) may be greater than the luminance of light at the angle of view at the left side of the baseline (that is, the angle of view is less than 0 degree, or the polar angle is less than 90 degrees). In other words, the luminance of the sub light corresponding to the angle of view at the left side of the baseline may be reduced through the light adjustment structure, and/or the luminance of the sub light corresponding to the angle of view at the right side of the baseline may be increased through the light adjustment structure. In such condition, as shown in FIG. 3, the second value L2 and the third value L3 respectively at two symmetrical sides of the baseline may be different, and the third value L3 may be less than the second value L2. In some embodiments, the first value L1 and the fourth value L4 may be different, wherein the first value L1 may be greater than the fourth value L4. Through the above-mentioned design, the sum of luminance of the sub light at the polar angle from 55 degrees to 65 degrees may be reduced, that is, the luminance of the first region IFR may be reduced, thereby reducing the influence of the light emitting device LD on the driver DR. In some embodiments, when the transportation VE is right-handed, or the light emitting device LD is applied to other equipment, the range of the first region IFR may be defined at first, and the luminance of the first region IFR may be reduced by the light adjustment structure to reduce the influence of the light emitting device LD on the specific user.

The third difference ratio may be the ratio of the first difference ratio (which is the ratio of the first value L1 to the fourth value L4) to the second difference ratio (which is the ratio of the second value L2 to the third value L3). Therefore, the third difference ratio may be greater when the first difference ratio becomes greater or the second difference ratio becomes lower. According to the present embodiment, since the third difference ratio may be greater than or equal to 1.23, the ratio of the first value L1 to the fourth value L4 may be greater than the ratio of the second value L2 to the third value L3, that is, the degree of difference between the first value L1 and the fourth value L4 may be greater than the degree of difference between the second value L2 and the third value L3. Therefore, the fourth value L4 may be reduced, that is, the luminance of the first region IFR may be reduced, thereby reducing the influence of the light emitting device LD on the driver DR. In addition, since the degree of difference between the second value L2 and the third value L3 may be lower than the degree of difference between the first value L1 and the fourth value L4, the influence of the light adjustment structure on the light emitting effect of the light emitting device LD may be reduced. In another aspect, since the third difference ratio may be less than or equal to 2.92, the possibility that the light emitting effect of the light emitting device LD is affected due to the large difference between the first difference ratio and the second difference ratio may be reduced. That is, by making the third difference ratio in the above-mentioned range, the luminance of the first region IFR may be reduced while the influence of the light adjustment structure on the light emitting effect of the light emitting device LD is reduced. When the third difference ratio is less than 1.23, the difference between the first value L1 and the fourth value L4 may not be enough to reduce the fourth value L4 effectively. When the third difference ratio is greater than 2.92, the degree of difference between the first value L1 and the fourth value L4 and the degree of difference between the second value L2 and the third value L3 may be excessive, thereby affecting the light emitting effect of the light emitting device LD.

It should be noted that the range of the third difference ratio in the present embodiment is not limited to the contents mentioned above. In some embodiments, the third value L3 may be less than the second value L2, and the third difference ratio may range from 1.38 to 2.67 (that is, 1.38≤third difference ratio≤2.67). That is, $L3<L2$; and $1.38 \leq (L1*L3)/(L2*L4) \leq 2.67$.

In some embodiments, the third value L3 may be less than the second value L2, and the third difference ratio may range from 1.23 to 2.00 (that is, 1.23≤third difference ratio≤2.00). That is, $L3<L2$; and $1.23 \leq (L1*L3)/(L2*L4) \leq 2.00$.

Figure 4:
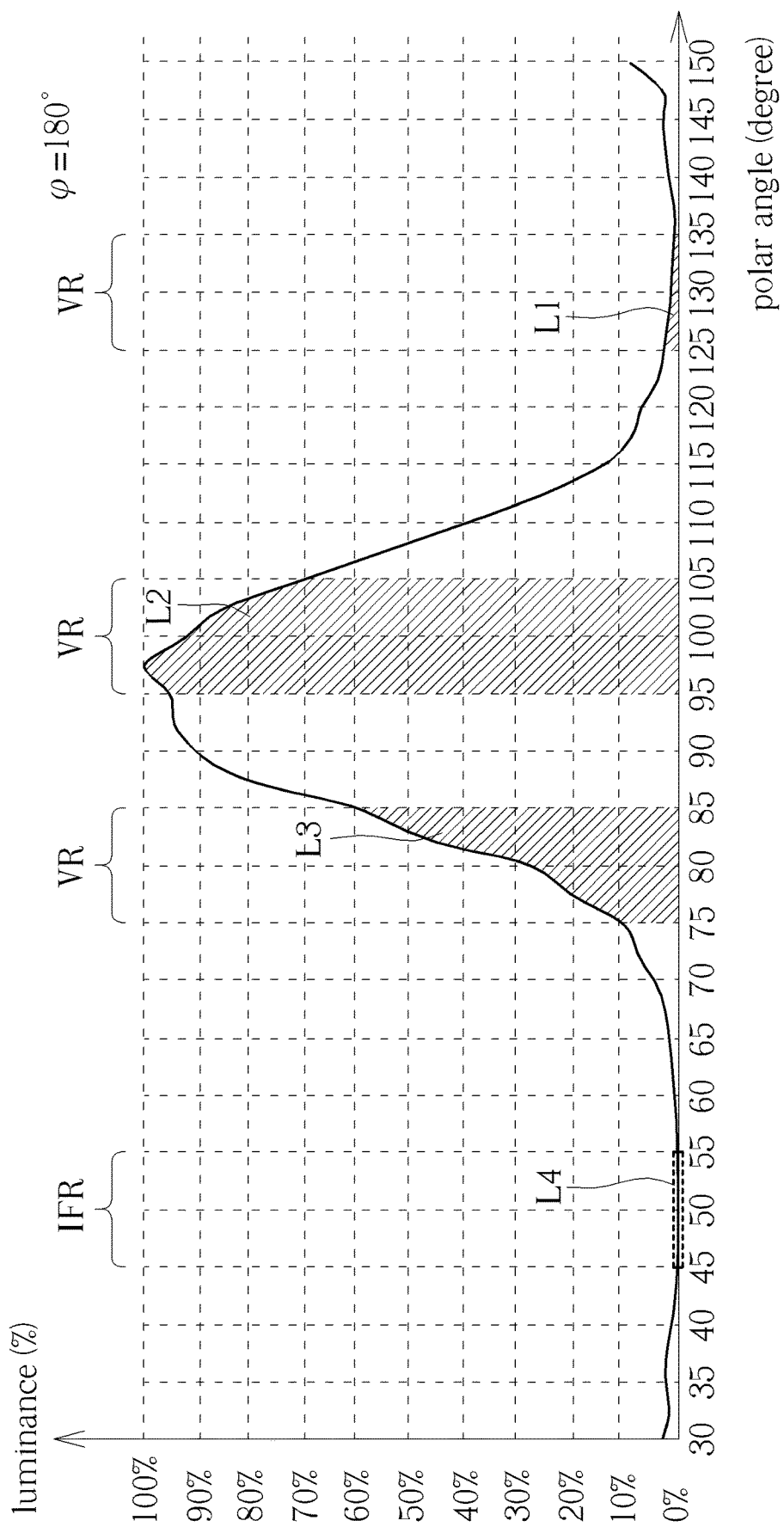
FIG. 4 schematically illustrates a relation between luminance and polar angle of a sub light defined as an output light of the electronic device corresponding to an azimuth angle according to a second embodiment of the present disclosure.

Referring to FIG. 4 and FIG. 1, FIG. 4 schematically illustrates a relation between luminance and polar angle of a sub light defined as an output light of the electronic device corresponding to an azimuth angle according to a second embodiment of the present disclosure. The relation curve shown in FIG. 4 is the same as the relation curve shown in FIG. 3, and will not be redundantly described. In the present embodiment, the first region IFR may be defined as the region in the light emitting region LER at the angle of view from −45 degrees to −35 degrees. Therefore, in the sub light defined as the output light corresponding to the azimuth angle of 180 degrees, the portion of the sub light at the polar angle from 45 degrees to 55 degrees may be the light in the first region IFR.

According to the present embodiment, in the distribution of luminance shown in FIG. 4, a first value L1 is a sum of a luminance of the sub light corresponding to a polar angle from 125 degrees to 135 degrees, a second value L2 is a sum of a luminance of the sub light corresponding to a polar angle from 95 degrees to 105 degrees, a third value L3 is a sum of a luminance of the sub light corresponding to a polar angle from 75 degrees to 85 degrees, and a fourth value L4 is a sum of a luminance of the sub light corresponding to a polar angle from 45 degrees to 55 degrees. It should be noted that since the fourth value L4 in FIG. 4 is too small, a dotted frame is used to represent the fourth value L4. The first value L1 and the fourth value L4 may be respectively defined at two sides of the baseline with a difference of 35 degrees to 45 degrees from the baseline, and the second value L2 and the third value L3 may be respectively defined at two sides of the baseline with a difference of 5 degrees to 15 degrees from the baseline. Since the portion of the sub light at the polar angle from 45 degrees to 55 degrees may be the light in the first region IFR, the light for defining the fourth value L4 may be the light in the first region IFR, and the light for defining the second value L2, the third value L3 and the first value L1 may be the light in the second region VR. The fourth value L4 may for example be the sum of luminance of the light in the first region IFR, but not limited thereto.

According to the present embodiment, the first value L1, the second value L2, the third value L3 and the fourth value L4 may satisfy the following relations:

$L3<L2$; and $2.5 \leq (L1*L3)/(L2*L4) \leq 9$.

Wherein (L1*L3)/(L2*L4) may be the third difference ratio. The description about the third difference ratio may refer to the contents mentioned above. In other words, the third difference ratio may range from 2.5 to 9 (that is, 2.5≤third difference ratio≤9).

It should be noted that the range of the third difference ratio in the present embodiment is not limited to the contents mentioned above. In some embodiments, the third value L3 may be less than the second value L2, and the third difference ratio may range from 4 to 8 (that is, 4≤third difference ratio≤8). That is, $L3<L2$; and $4 \leq (L1*L3)/(L2*L4) \leq 8$.

By making the third value L3 less than the second value L2 and making the third difference ratio in the above-mentioned range, the luminance of the first region IFR may be reduced while the influence of the light adjustment structure on the light emitting effect of the light emitting device LD is reduced.

Figure 5:
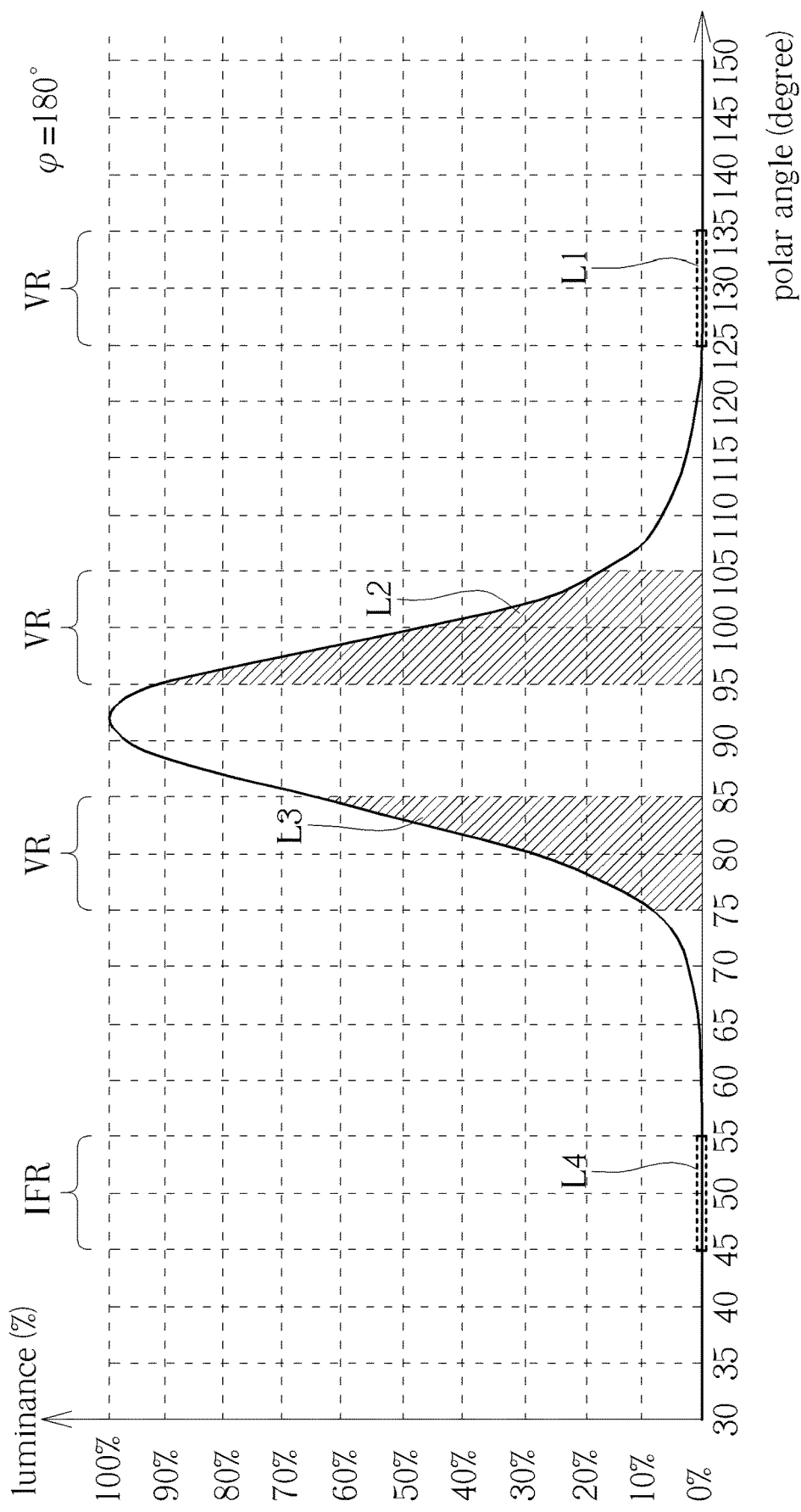
FIG. 5 schematically illustrates a relation between luminance and polar angle of a sub light defined as an output light of the electronic device corresponding to an azimuth angle according to a third embodiment of the present disclosure.

Referring to FIG. 5, FIG. 5 schematically illustrates a relation between luminance and polar angle of a sub light defined as an output light of the electronic device corresponding to an azimuth angle according to a third embodiment of the present disclosure. Specifically, FIG. 5 shows the distribution of luminance of the sub light defined as the output light corresponding to the azimuth angle of 180 degrees with the polar angle, wherein the output light is emitted from the light emitting device including the light adjustment structure. The output light emitted by the light emitting device LD of the present embodiment may be a normalized light, but not limited thereto. In some embodiments, the light emitting device LD may include organic light emitting diodes (OLED). In some embodiments, the light emitting device LD may include dual backlight respectively providing normalized light and non-normalized light. In the present embodiment, the first region IFR may be the region in the light emitting region LER at the angle of view from −45 degrees to −35 degrees. Therefore, in the sub light defined as the output light corresponding to the azimuth angle of 180 degrees, the portion of the sub light at the polar angle from 45 degrees to 55 degrees may be the light in the first region IFR.

According to the present embodiment, in the distribution of luminance shown in FIG. 5, a first value L1 is a sum of a luminance of the sub light corresponding to a polar angle from 125 degrees to 135 degrees, a second value L2 is a sum of a luminance of the sub light corresponding to a polar angle from 95 degrees to 105 degrees, a third value L3 is a sum of a luminance of the sub light corresponding to a polar angle from 75 degrees to 85 degrees, and a fourth value L4 is a sum of a luminance of the sub light corresponding to a polar angle from 45 degrees to 55 degrees. It should be noted that since the first value L1 and the fourth value L4 in FIG. 5 are relatively small, dotted frames are respectively used to represent the first value L1 and the fourth value L4. The first value L1 and the fourth value L4 may be respectively defined at two sides of the baseline with a difference of 35 degrees to 45 degrees from the baseline, and the second value L2 and the third value L3 may be respectively defined at two sides of the baseline with a difference of 5 degrees to 15 degrees from the baseline. Since the portion of the sub light at the polar angle from 45 degrees to 55 degrees may be the light in the first region IFR, the light for defining the fourth value L4 may be the light in the first region IFR, and the light for defining the second value L2, the third value L3 and the first value L1 may be the light in the second region VR. The fourth value L4 may for example be the sum of luminance of the light in the first region IFR, but not limited thereto.

In the present embodiment, a first difference ratio may be defined as the ratio of the second value L2 to the first value L1 (that is, L2/L1), and a second difference ratio may be defined as the ratio of the third value L3 to the fourth value L4 (that is, L3/L4). After the first difference ratio and the second difference ratio are defined, the ratio of the first difference ratio to the second difference ratio may be defined as a third difference ratio. In other words, the third difference ratio may be represented as (L2*L4)/(L1*L3). According to the present embodiment, the first value L1, the second value L2, the third value L3 and the fourth value L4 may satisfy the following relations:

$$L3<L2; \text{ and}$$

$$1.1 \leq (L2*L4)/(L1*L3).$$

In other words, the third difference ratio may be greater than or equal to 1.1 (that is, 1.1≤third difference ratio).

Since the first difference ratio may be the ratio of the second value L2 to the first value L1 which are located at the right side of the baseline, and the second difference ratio may be the ratio of the third value L3 to the fourth value L4 which are located at the left side of the baseline, the third difference ratio may be used for comparing the difference between the values at the right side of the baseline and the difference between the values at the left side of the baseline. By making the third value L3 less than the second value L2 and making the third difference ratio in the above-mentioned range, the luminance of the first region IFR may be reduced while the influence of the light adjustment structure on the light emitting effect of the light emitting device LD is reduced.

It should be noted that the range of the third difference ratio of the present embodiment is not limited to the above-mentioned contents. In some embodiments, the third value L3 may be less than the second value L2, and the third difference ratio may be greater than or equal to 1.3 (that is, 1.3≤third difference ratio). That is, $$L3<L2; \text{ and}$$

$$1.3 \leq (L2*L4)/(L1*L3).$$

In some embodiments, the third value L3 may be less than the second value L2, and the third difference ratio may range from 1.3 to 100 (that is, 1.3≤third difference ratio≤100). That is, $$L3<L2; \text{ and}$$

$$1.3 \leq (L2*L4)/(L1*L3) \leq 100.$$

Figure 6:
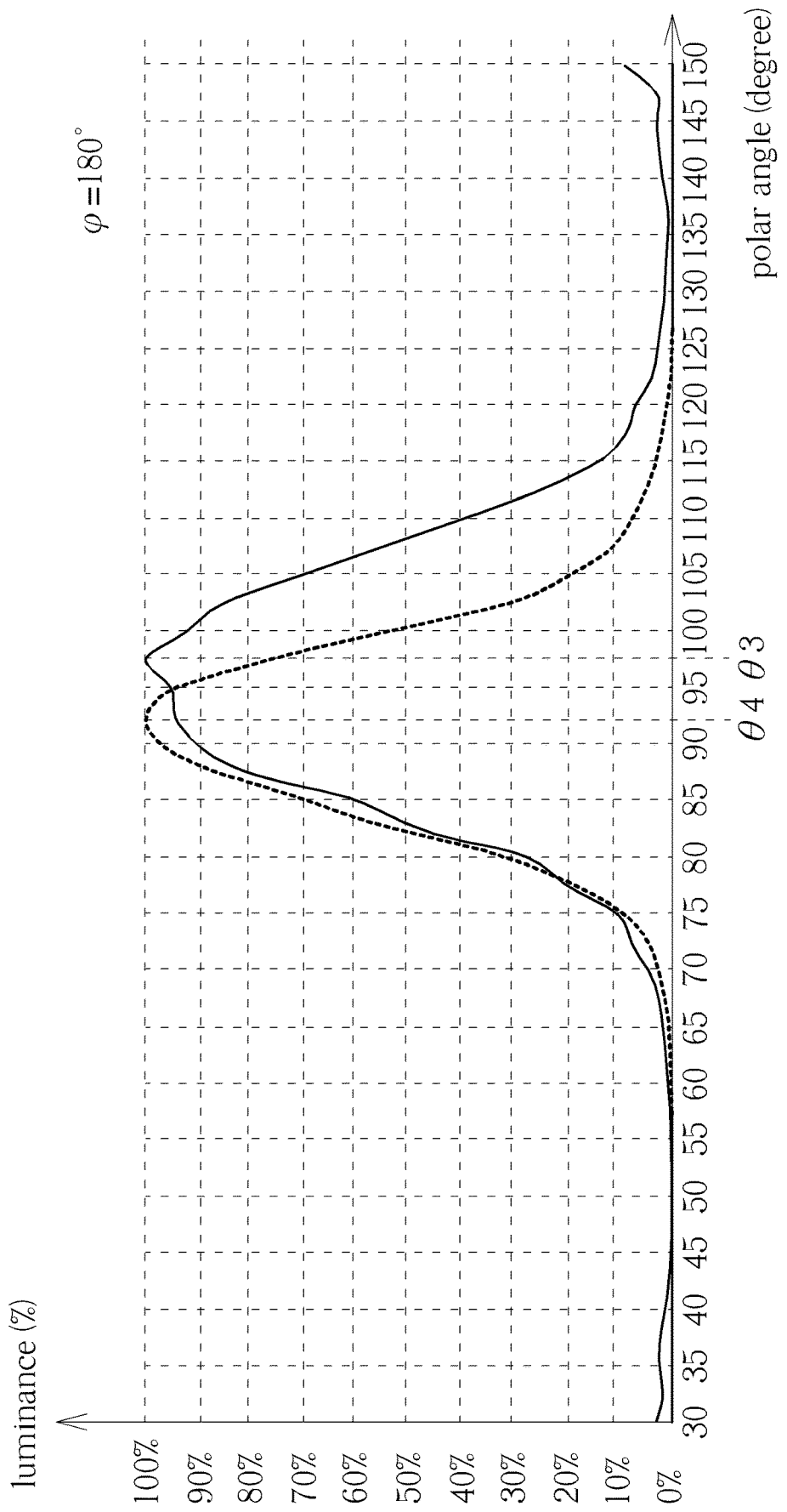
FIG. 6 shows the relations between luminance and polar angle in FIG. 3 and FIG. 5.

Referring to FIG. 6, FIG. 6 shows the relations between luminance and polar angle in FIG. 3 and FIG. 5, wherein the solid line in FIG. 6 corresponds to the relation diagram between polar angle and luminance in FIG. 3, and the dotted line in FIG. 6 corresponds to the relation diagram between polar angle and luminance in FIG. 5. As mentioned above, the light adjustment structure of the light emitting device LD may adjust light path, such that the luminance of light at the angle of view at the left side of the baseline (that is, the angle of view is less than 0 degree, or the polar angle is less than 90 degrees) may be reduced, and/or the luminance of light at the angle of view at the right side of the baseline (that is, the angle of view is greater than 0 degree, or the polar angle is greater than 90 degrees) may be increased. Therefore, compared with traditional electronic devices, the maximum luminance of the light emitting device LD in the present embodiment may not occur at the angle of view of 0 degree (or the polar angle of 90 degrees). Specifically, in the curve shown in FIG. 3 (or FIG. 4), the maximum luminance (100%) of the sub light is corresponding to a maximum luminance polar angle θ3, and in the curve shown in FIG. 5, the maximum luminance (100%) of the sub light is corresponding to a maximum luminance polar angle θ4, wherein the maximum luminance polar angle θ3 and the maximum luminance polar angle θ4 may be greater than 90 degrees. In some embodiments, the maximum luminance polar angle θ3 and the maximum luminance polar angle θ4 may be greater than or equal to 91 degrees and less than or equal to 105 degrees (that is, 91°≤θ3≤105°, 91°≤θ4≤105°). In some embodiments, the maximum luminance polar angle θ3 and the maximum luminance polar angle θ4 may be greater than or equal to 92 degrees and less than or equal to 100 degrees (that is, 92°≤θ3≤100°, 92°≤θ4≤100°). It should be noted that when the maximum luminance polar angle θ3 (or the maximum luminance polar angle θ4) is excessive large (for example, greater than 105 degrees), the light emitting effect of the light emitting device LD may be affected.

The detailed structure of the light emitting device LD including the light adjustment structure of the present disclosure will be detailed in the following.

Figure 7:
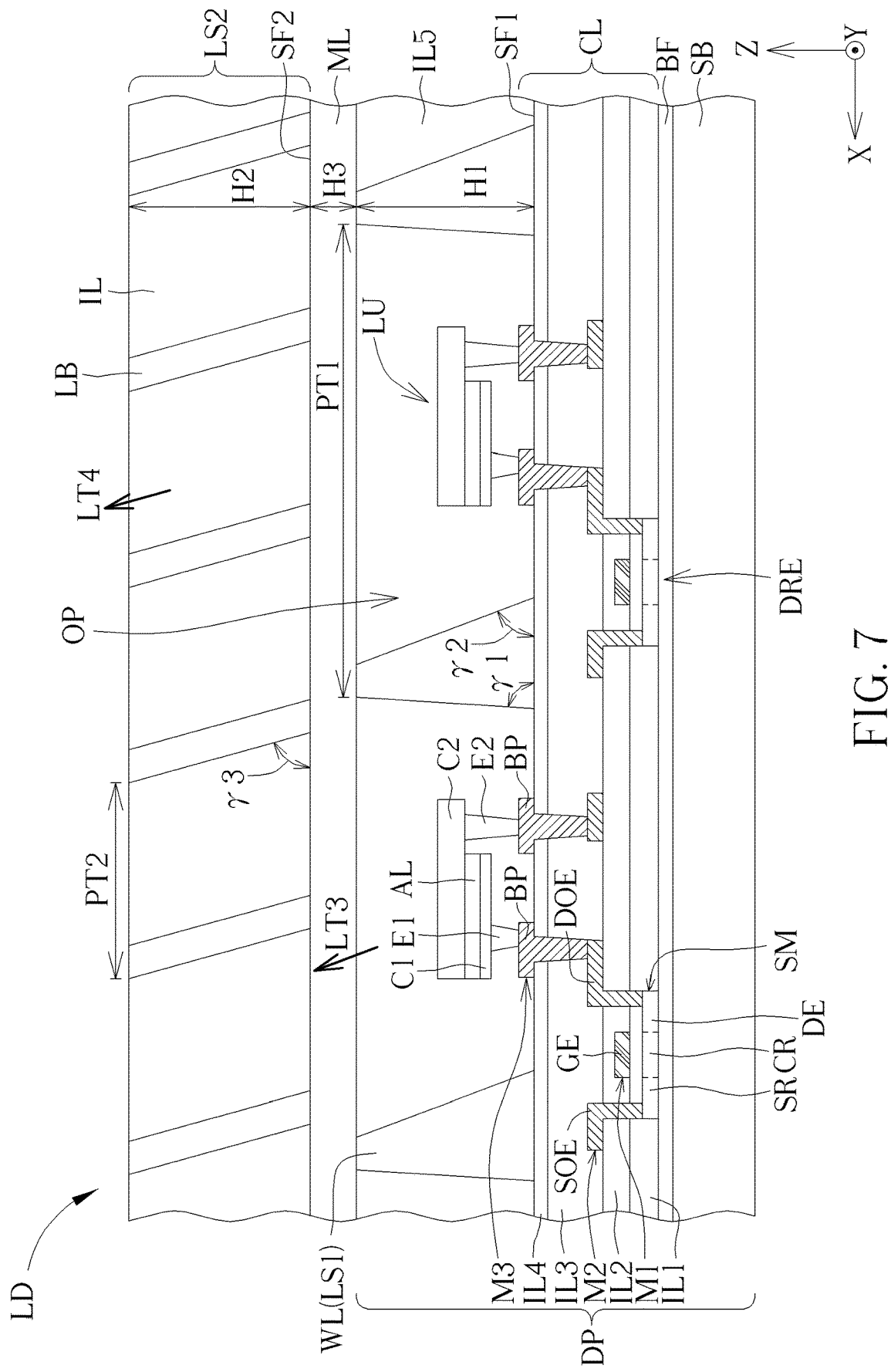
FIG. 7 schematically illustrates a cross-sectional view of the electronic device according to the first embodiment of the present disclosure.
Figure 8:
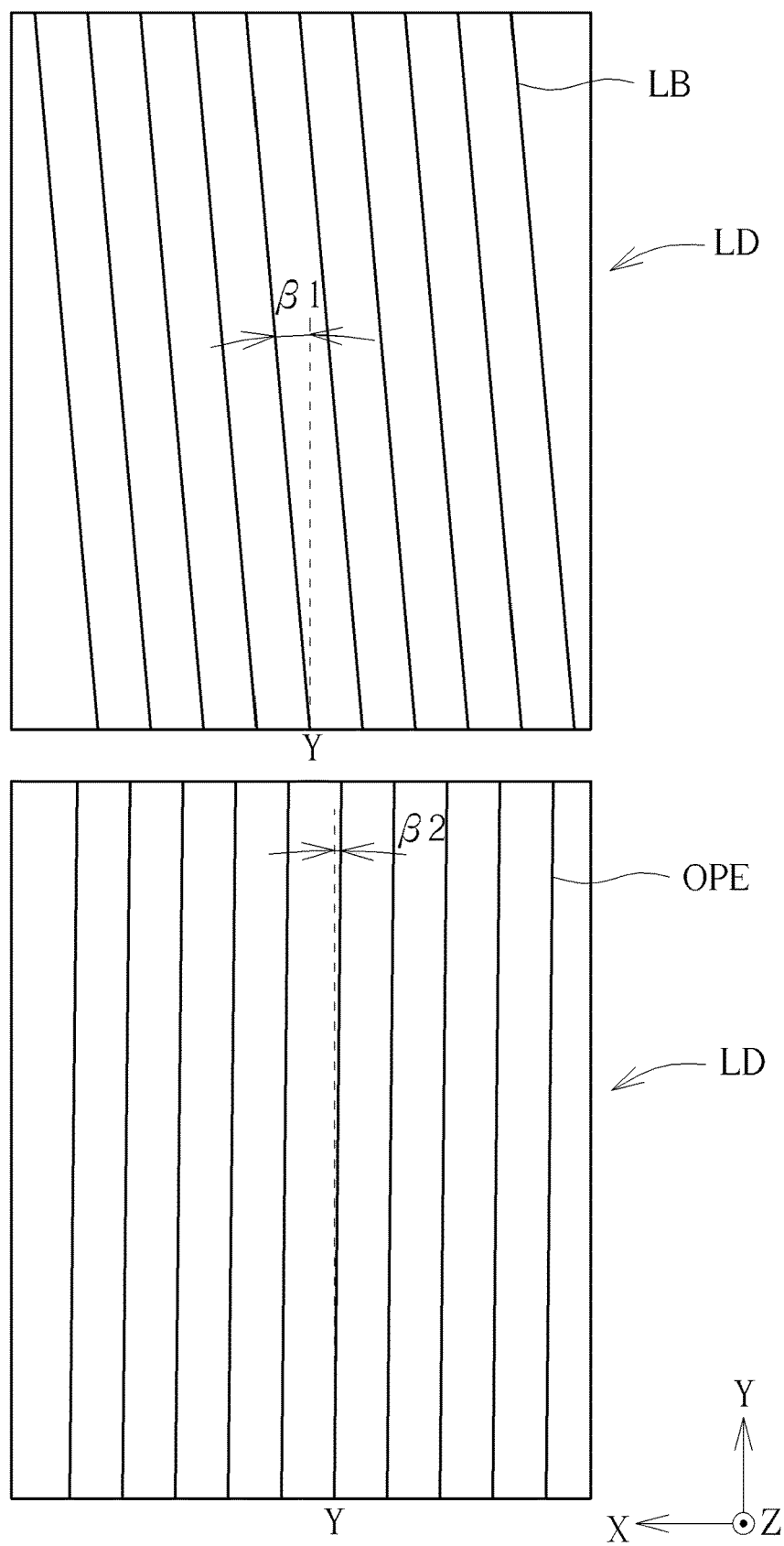
FIG. 8 schematically illustrates a top view of a light blocking element according to the first embodiment of the present disclosure.

Referring to FIG. 7 and FIG. 8, FIG. 7 schematically illustrates a cross-sectional view of the electronic device according to the first embodiment of the present disclosure, and FIG. 8 schematically illustrates a top view of a light blocking element according to the first embodiment of the present disclosure. According to the present embodiment, the light emitting device LD may be a display device and may include a display panel DP. The display panel DP may include a substrate SB, a circuit layer CL disposed on the substrate SB and light emitting units LU disposed on the circuit layer CL. The substrate SB may include a rigid substrate or a flexible substrate, but not limited thereto. The rigid substrate for example includes glass, quartz, sapphire, ceramic, other suitable materials or combinations of the above-mentioned materials. The flexible substrate for example includes polyimide (PI), polycarbonate (PC), polyethylene terephthalate (PET), other suitable materials or combinations of the above-mentioned materials. The circuit layer CL may be disposed between the substrate SB and the light emitting units LU, wherein the circuit layer CL may include any suitable electronic element. The electronic element may include active elements and/or passive elements, such as capacitor, resistor, inductor, diode, transistor, sensor, and the like, but not limited thereto. For example, the circuit layer CL may include at least one driving element DRE, wherein the driving element DRE may include a transistor, such as a thin film transistor (TFT), but not limited thereto. The driving element DRE may be electrically connected to the light emitting unit LU, thereby controlling and/or driving the light emitting unit LU to emit light. Specifically, the circuit layer CL may include a semiconductor layer SM, a conductive layer M1, a conductive layer M2 and a conductive layer M3, but not limited thereto. The driving element DRE may for example be a thin film transistor and include the semiconductor layer SM and a gate electrode GE. The semiconductor layer SM of the driving element DRE may include a channel region CR, a source region SR and a drain region DE, the gate electrode GE may be disposed corresponding to the channel region CR, and the gate electrode GE may be formed of the conductive layer M1. The driving element DRE may further include a source electrode SOE and a drain electrode DOE, wherein the source electrode SOE and the drain electrode DOE may be formed of the conductive layer M2 and be respectively electrically connected to the source region SR and the drain region DE of the semiconductor layer SM. The conductive layer M3 may form the bonding pads BP, and the light emitting unit LU may be electrically connected to the driving element DRE through the bonding pads BP. The conductive layer M1, the conductive layer M2 and the conductive layer M3 may include any suitable conductive material, such as metal materials, but not limited thereto. The circuit layer CL may further include an insulating layer IL1 disposed between the semiconductor layer SM and the conductive layer M1, an insulating layer IL2 disposed between the conductive layer M1 and the conductive layer M2, and an insulating layer IL3 and an insulating layer IL4 disposed between the conductive layer M2 and the conductive layer M3, wherein the insulating layer IL1, the insulating layer IL2, the insulating layer IL3 and the insulating layer IL4 may include any suitable organic insulating material (for example, poly (methyl methacrylate) (PMMA), epoxy resin, siloxane, silica gel, other suitable materials or combinations of the above-mentioned materials) or inorganic insulating material (for example, silicon nitride, silicon oxide, titanium oxide, aluminum oxide, other suitable materials or combinations of the above-mentioned materials). It should be noted that the numbers of the conductive layers and the insulating layers in the circuit layer CL and the disposition ways of the electronic elements shown in FIG. 7 are exemplary, and the present disclosure is not limited thereto. The display panel DP may optionally include a buffer layer BF disposed between the substrate SB and the circuit layer CL to provide buffering effect, but not limited thereto. The light emitting unit LU may include a light emitting diode. As shown in FIG. 7, the light emitting unit LU of the present embodiment may include an inorganic light emitting diode, but not limited thereto. Specifically, the light emitting unit LU may include a semiconductor C1, a semiconductor C2, a light emitting layer AL located between the semiconductor C1 and the semiconductor C2, a first electrode E1 electrically connected to the semiconductor C1 and a second electrode E2 electrically connected to the semiconductor C2, but not limited thereto. The light emitting unit LU may be electrically connected to the bonding pads BP through the first electrode E1 and the second electrode E2, thereby being electrically connected to the driving element DRE and/or other suitable electronic elements through the bonding pads BP, such that the light emission of the light emitting unit LU may be controlled by the driving element DRE. The display panel DP may further include wall structures WL disposed on the substrate SB, wherein the wall structures WL may include a plurality of openings OP, and the light emitting units LU may be disposed in the openings OP. The openings OP may for example be arranged in an array, but not limited thereto. In other words, the wall structure WL may serve as the pixel defining layer (PDL). The light emitting device LD may further include an insulating layer IL5 filled into the openings OP and covering the light emitting units LU. The insulating layer IL5 may include any suitable insulating material which is mentioned above, and will not be redundantly described. Since the insulating layer IL5 covers the light emitting units LU, the insulating layer IL5 may for example include transparent materials to reduce the influence of the insulating layer IL5 on the light emitting efficiency of the light emitting units LU. The insulating layer IL5 may serve as a planarization layer to provide a flat surface for easily disposing other layers on the insulating layer IL5, but not limited thereto. It should be noted that the structure of the display panel DP of the present embodiment is not limited to what is shown in FIG. 7, and the display panel DP may further include any suitable element and/or layer.

In some embodiments, the light adjustment structure LS1 of the light emitting device LD may be the wall structure WL. Specifically, the wall structure WL may have a trapezoidal shape in a cross-sectional view (that is, FIG. 7) of the light emitting device LD along the direction X, wherein the two sides of the trapezoidal shape may be sloped differently, but not limited thereto. In detail, an included angle $\gamma 1$ may be included between a side of the trapezoidal shape of the wall structure WL and a top surface SF1 of the insulating layer IL4, and an included angle $\gamma 2$ may be included between another side of the trapezoidal shape of the wall structure WL and the top surface SF1 of the insulating layer IL4 respectively, wherein the included angle $\gamma 1$ and the included angle $\gamma 2$ may be different. By making the included angle $\gamma 1$ and the included angle $\gamma 2$ different, the openings OP of the wall structure WL would be tilted, thereby achieving the effect of changing the light path of the light emitted by the light emitting units LU. For example, as shown in FIG. 7, the included angle $\gamma 1$ may be greater than the included angle $\gamma 2$, such that the openings OP may be inclined toward the direction X. In such condition, the probability that the light (such as the light LT3) emitted by the light emitting units LU is altered toward the direction X may be increased, thereby achieving the effect of reducing the luminance of the first region IFR (as shown in FIG. 1). In some other embodiments, the included angle $\gamma 1$ may be less than the included angle $\gamma 2$, such that the openings OP may be inclined toward the direction –X. In such condition, the probability that the output light of the light emitting units LU is altered toward the direction –X may be increased. In other words, the wall structure WL of the present embodiment may serve as the light adjustment structure LS1.

In some embodiments, the light emitting device LD may include the light adjustment structure LS2 disposed on the display panel DP. Specifically, the light adjustment structure LS2 may be disposed on the display panel DP through an intermediate layer ML to form the light emitting device LD. In some embodiments, the intermediate layer ML may for example be optical clear adhesive (OCA) or optically clear resin (OCR), such that the light adjustment structure LS2 can be adhered to the display panel DP. The light adjustment structure LS2 may be disposed on the light output surface of the display panel DP, such that the light emitted by the light emitting units LU may pass through the light adjustment structure LS2. In some embodiments, the intermediate layer ML may serve as a planarization layer, an optical layer or other suitable layers. The light adjustment structure LS2 may include light blocking elements LB and an insulating layer IL filled between the light blocking elements LB, but not limited thereto. The light blocking elements LB may include any suitable light absorbing material, such as black resins or gray resins, but not limited thereto. The insulating layer IL may include any suitable insulating material which is mentioned above, and will not be redundantly described. The insulating layer IL may for example include transparent materials to reduce the influence of the insulating layer IL on the light emitting efficiency of the light emitting units LU. As shown in FIG. 7, in the cross-sectional view of the light emitting device LD along the direction X, the extending direction (or the height direction) of the light blocking elements LB may not parallel to the top view direction (that is, the direction −Z) of the light emitting device LD. Specifically, an included angle γ3 may be included between the extending direction of the light blocking elements LB and the top surface SF2 of the intermediate layer ML, wherein the included angle γ3 may not be equal to 90 degrees. By disposing the light adjustment structure LS2 on the light output surface of the display panel DP, the light path of the light emitted by the light emitting units LU may be adjusted after the light passes through the light adjustment structure LS2, thereby forming the light LT4 (the output light). In the present embodiment, since the light blocking elements LB may be tilted toward the direction X in the cross-sectional view of the light emitting device LD along the direction X, the light LT4 may be altered toward the direction X, such that the luminance of the first region IFR may be reduced (as shown in FIG. 1). In some other embodiments, when the light blocking elements LB are tilted toward the direction −X in the cross-sectional view of the light emitting device LD along the direction X, the output light may be altered toward the direction −X.

As shown in FIG. 7, the light blocking elements LB may have a height H2 in the top view direction (that is, the direction −Z) of the light emitting device LD. In some embodiments, the light blocking elements LB may include suspended particles having rotation light shielding property, dye liquid crystal, electrochromic materials or other suitable materials. In an embodiment, the light blocking elements LB may include suspended particles having rotation light shielding property, and the distribution of the suspended particles in the light blocking elements LB may be changed by applying voltage or through other ways, thereby achieving the effect of controlling the height H2 of the light blocking elements LB. For example, when the suspended particles are dispersed in the entire light blocking element LB, the height H2 may be greater; and when the suspended particles are dispersed in a region of the light blocking element LB close to the intermediate layer ML, the height H2 (or can be referred as the effective height) may be smaller. In some embodiments, the height H2 and the degree of tilt (that is, the included angle γ3) of the light blocking elements LB may be controlled through a micro-electronic-mechanical system (MEMS), but the present disclosure is not limited thereto.

According to the present embodiment, as shown in FIG. 8, the light blocking elements LB may be string-shaped in the top view of the light emitting device LD and extend along a direction, wherein the extending direction of the light blocking elements LB may not be parallel to the extending direction of the opaque elements OPE in the light emitting device LD. Specifically, an included angle β1 may be included between the extending direction of the light blocking elements LB and the direction Y, and an included angle β2 may be included between the extending direction of the opaque elements OPE and the direction Y, wherein the included angle β1 may be different from the included angle β2. In some embodiments, the opaque elements OPE may be the black matrix in the display panel DP. In some embodiments, the opaque elements OPE may be the wall structure WL (shown in FIG. 7). In some embodiments, the opaque elements OPE may be the signal lines or wires in the display panel DP, such as scan lines or data lines. In the present embodiment, the included angle β1 may be greater than the included angle β2, that is, the degree of alteration of the arranging direction of the light blocking elements LB from the direction Y may be greater than the degree of alteration of the extending direction of the opaque elements OPE from the direction Y, but not limited thereto. In some embodiments, the included angle β2 may be 0 degree, that is, the arranging direction of the opaque elements OPE may be parallel to the direction Y. In some embodiments, the difference between the included angle β1 and the included angle β2 may range from 0.1 degree to 5 degrees. In some embodiments, the difference between the included angle β1 and the included angle β2 may range from 1 degree to 45 degrees. By making the extending direction of the light blocking elements LB not parallel to the extending direction of the opaque elements OPE, the possibility of occurrence of moiré pattern may be reduced, thereby improving the display quality of the light emitting device LD.

In some embodiments, the light emitting device LD may include the light adjustment structure LS1 (that is, the wall structure WL) and the light adjustment structure LS2. In some embodiments, the light emitting device LD may include one of the light adjustment structure LS1 and the light adjustment structure LS2. As shown in FIG. 7, in the top view direction (that is, the direction −Z) of the light emitting device LD, the wall structure WL may have a height H1, and the intermediate layer ML may have a thickness H3. In the direction X, a pitch PT1 may be included between adjacent wall structures WL, and a pitch PT2 may be included between adjacent light blocking elements LB. The height H1 may be defined as the maximum height of the wall structure WL. The thickness H3 may be defined as the maximum thickness of the intermediate layer ML. In the cross-sectional view shown in FIG. 7, the pitch PT1 may be defined as the distance between a vertex of a wall structure WL and a corresponding vertex of another wall structure WL adjacent to the wall structure WL, and the pitch PT2 may be defined as the distance between a vertex of a light blocking element LB and a corresponding vertex of another light blocking element LB adjacent to the light blocking element LB. According to the present embodiment, when the light emitting device LD includes the light adjustment structure LS1 and the light adjustment structure LS2, the height H1 of the wall structure WL may be greater than the height H2 of the light blocking element LB, and the height H2 of the light blocking element LB may be greater than the thickness H3 of the intermediate layer ML (that is, H3<H2<H1). In addition, the pitch PT1 between adjacent wall structures WL may be greater than the pitch PT2 between adjacent light blocking elements LB (that is, PT2<PT1). Furthermore, the included angle γ1 between a side of the wall structure WL and the top surface SF1 of the insulating layer IL4 and the included angle γ2 between another side of the wall structure WL and the top surface SF1 of the insulating layer IL4 may be greater than the included angle γ3 between the light blocking elements LB and the top surface SF2 of the intermediate layer ML (that is, γ1>γ3, γ2>γ3).

The structure of the light adjustment structure of the present embodiment is not limited to the above-mentioned structure. In some embodiments, the light emitting device LD may further include a rotation controlling unit, such as a mechanical rotary axis, and the influence of the output light emitted by the light emitting device LD on the driver DR may be reduced by adjusting the direction of the output light by rotating the light emitting device LD. In some embodiments, as shown in FIG. 1, in order to reduce the influence of the output light of the light emitting device LD on the driver DR when the driver DR is watching the rearview mirror SIM, an anti-reflection design may be made for the window WD next to the passenger seat PSS, thereby reducing the possibility that the output light is reflected by the window WD and affects the driver DR.

It should be noted that the structure of the light emitting device LD of the present disclosure is not limited to what is shown in FIG. 7, and the light emitting device LD may further include other suitable elements and/or layers. Other embodiments of the structure of the light emitting device LD of the present disclosure will be described in the following. In order to simplify the description, the same elements or layers in the following embodiments would be labeled with the same symbol, and the features thereof will not be redundantly described. The differences between the embodiments will be detailed in the following.

Figure 9:
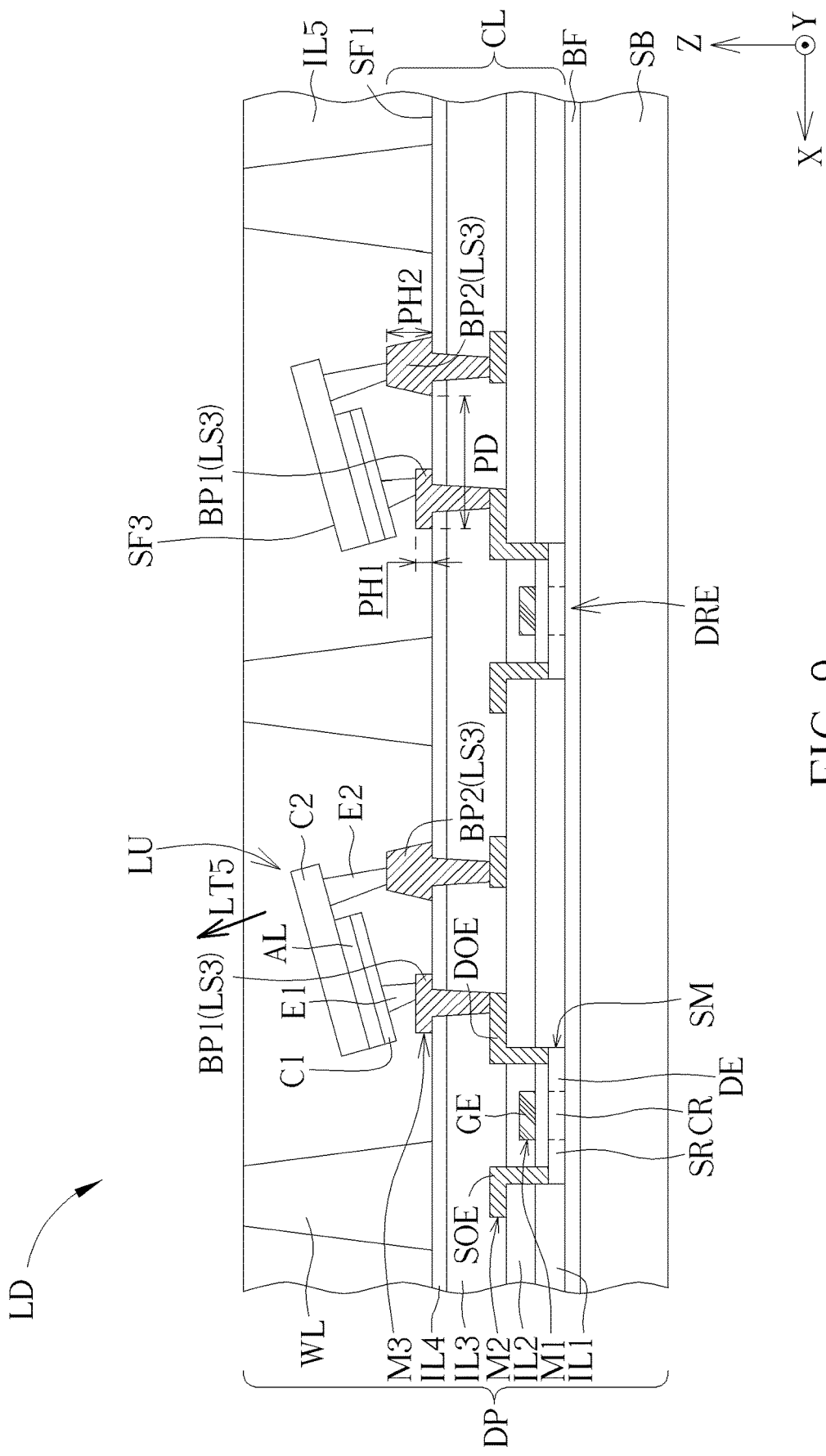
FIG. 9 schematically illustrates a cross-sectional view of an electronic device according to a second embodiment of the present disclosure.

Referring to FIG. 9, FIG. 9 schematically illustrates a cross-sectional view of an electronic device according to a second embodiment of the present disclosure. As shown in FIG. 9, the first electrode E1 and the second electrode E2 of the light emitting unit LU may respectively be disposed on the bonding pad BP1 and the bonding pad BP2. According to the present embodiment, in the top view direction (that is, the direction −Z) of the light emitting device LD, the bonding pad BP1 may have a height PH1, and the bonding pad BP2 may have a height PH2, wherein the height PH1 and the height PH2 may be different. The height PH1 may be defined as the maximum height of the bonding pad BP1, and the height PH2 may be defined as the maximum height of the bonding pad BP2. Since the height of the bonding pad BP1 and the height of the bonding pad BP2 may be different, the light emitting unit LU disposed on the bonding pad BP1 and the bonding pad BP2 may be tilted toward a direction (or tilted toward the bonding pad with the lower height). Therefore, the effect of adjusting the light path of the light emitted by the light emitting unit LU may be achieved. Specifically, in the present embodiment, the height PH2 of the bonding pad BP2 may be greater than the height PH1 of the bonding pad BP1, such that the normal direction of the top surface SF3 of the light emitting unit LU may be inclined from the direction Z to the direction X. In such condition, the probability that the light (such as the light LT5) emitted by the light emitting unit LU is altered toward the direction X may be increased, thereby achieving the effect of reducing the luminance of the first region IFR (as shown in FIG. 1). In some embodiments, the height PH2 of the bonding pad BP2 may be less than the height PH1 of the bonding pad BP1, such that the normal direction of the top surface SF3 of the light emitting unit LU may be inclined from the direction Z to the direction −X. In such condition, the probability that the light emitted by the light emitting unit LU is altered toward the direction −X may be increased. In other words, the bonding pad BP1 and/or the bonding pad BP2 may serve as the light adjustment structure LS3 in the present embodiment.

As shown FIG. 9, a pitch PD may be included between the bonding pad BP1 and the bonding pad BP2, wherein the pitch PD may be defined as the distance between the leftmost side of the bottom outline of the bonding pad BP1 in the top view direction (that is, the direction −Z) and the leftmost side of the bottom outline of the bonding pad BP2 in the top view direction, but not limited thereto. According to the present embodiment, the pitch PD, the height PH1 and the height PH2 may satisfy the following relation:

$$\arctan(|PH2-PH1|/PD)>5°$$

By making the pitch PD, the height PH1 and the height PH2 satisfy the above-mentioned relation, the degree of tilt of the light emitting unit LU may be adjusted to adjust the light path, thereby reducing the possibility of the output light affecting the driver DR.

Figure 10:
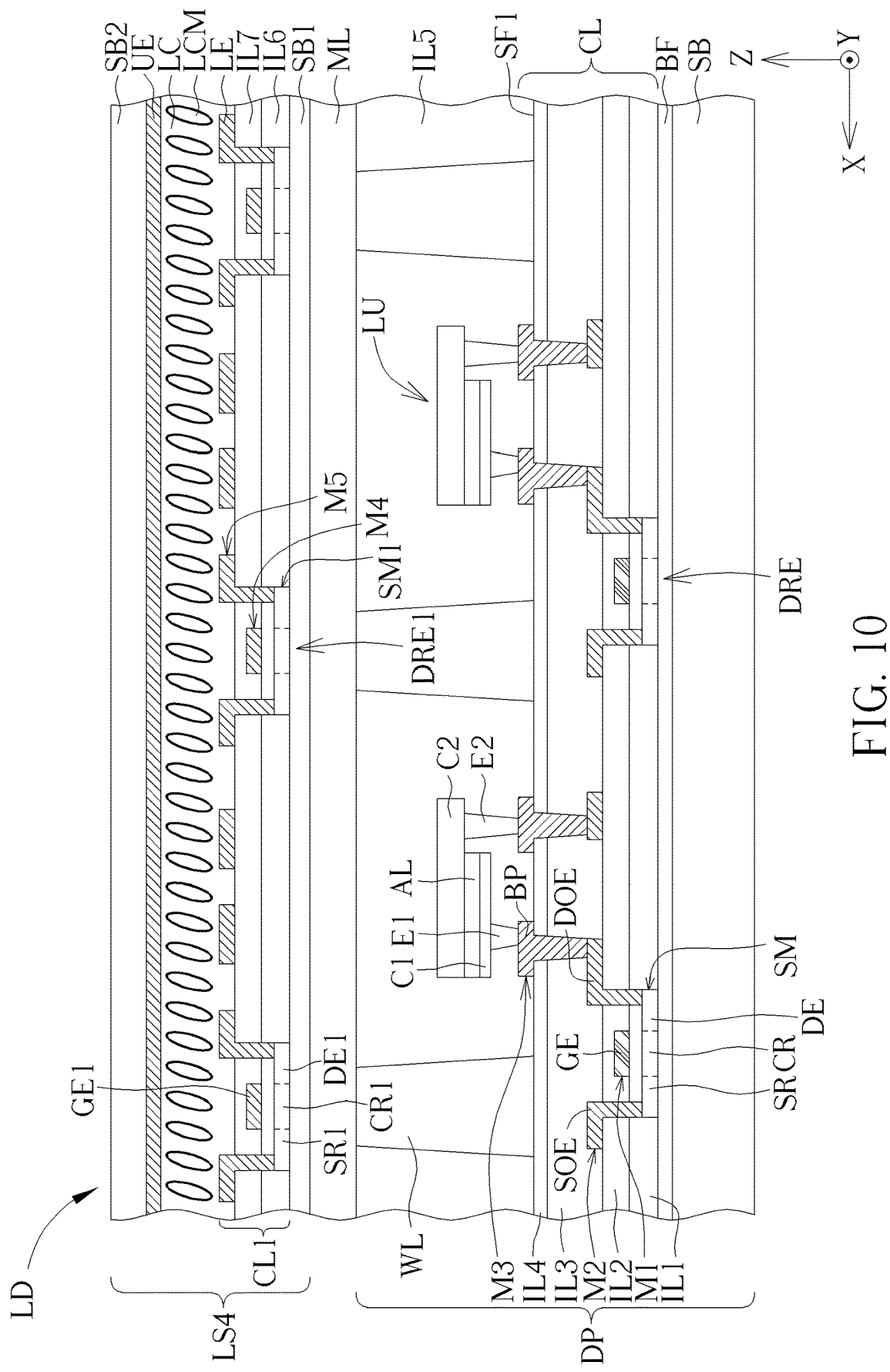
FIG. 10 schematically illustrates a cross-sectional view of an electronic device according to a third embodiment of the present disclosure.

Referring to FIG. 10, FIG. 10 schematically illustrates a cross-sectional view of an electronic device according to a third embodiment of the present disclosure. According to the present embodiment, the light emitting device LD may include a light adjustment structure LS4 disposed on the display panel DP, wherein the light adjustment structure LS4 may be disposed on the light output surface of the display panel DP. The light adjustment structure LS4 of the present embodiment may be a liquid crystal unit, but not limited thereto. For example, the light adjustment structure LS4 may include an electrically controlled birefringence (ECB) liquid crystal unit or a twist nematic (TN) liquid crystal unit, but not limited thereto. The light adjustment structure LS4 may be disposed on the display panel DP through the intermediate layer ML, but not limited thereto. The features of the intermediate layer ML may refer to the contents mentioned above, and will not be redundantly described. Specifically, as shown in FIG. 10, the light adjustment structure LS4 may include a substrate SB1, a substrate SB2, a circuit layer CL1 disposed between the substrate SB1 and the substrate SB2, a liquid crystal layer LC and a top electrode UE. The materials of the substrate SB1 and the substrate SB2 may refer to the contents about the substrate SB mentioned above, and will not be redundantly described. The liquid crystal layer LC includes liquid crystal molecules LCM. The circuit layer CL1 may for example include driving elements DRE1, wherein the driving elements DRE1 may drive the liquid crystal molecules LCM in the liquid crystal layer LC to rotate. The circuit layer CL1 may include a semiconductor layer SM1, a conductive layer M4 and a conductive layer M5. The driving element DRE1 may include the semiconductor layer SM1 and a gate electrode GE1. The semiconductor layer SM1 of the driving element DRE1 may include a channel region CR1, a source region SR1 and a drain region DE1. The gate electrode GE1 of the driving element DRE1 may be disposed corresponding to the channel region CR1 and formed of the conductive layer M4. The conductive layer M5 may form a bottom electrode LE electrically connected to the source region SR1 and/or the drain region DE1. The circuit layer CL1 may further include an insulating layer IL6 disposed between the semiconductor layer SM1 and the conductive layer M4 and an insulating layer IL7 disposed between the conductive layer M4 and the conductive layer M5. The top electrode UE may be provided with a common voltage, and the driving element DRE1 may provide a voltage to the bottom electrode LE, thereby forming an electric field between the top electrode UE and the bottom electrode LE, wherein the liquid crystal molecules LCM may be affected by the electric field and rotate. In some embodiments, the refractive index may be changed by the rotation of the liquid crystal molecules LCM, such that the light path of a light may be changed after the light passes through the light adjustment structure LS4. In some embodiments, the output light with a large angle may be removed by the rotation of the liquid crystal molecules LCM. Therefore, the effect of changing the light path of the output light may be achieved through the light adjustment structure LS4.

In the present embodiment, the driving elements DRE1 of the light adjustment structure LS4 may be disposed correspondingly to the opaque elements in the display panel DP. For example, in the top view direction of the light emitting device LD, the driving elements DRE1 may at least partially overlap the wall structures WL of the display panel DP, but not limited thereto. In other words, the driving elements DRE1 may be disposed not corresponding to the light emitting region of the light emitting device LD. Therefore, the influence of the driving elements DRE1 on the light emitting effect of the light emitting device LD may be reduced.

Figure 11:
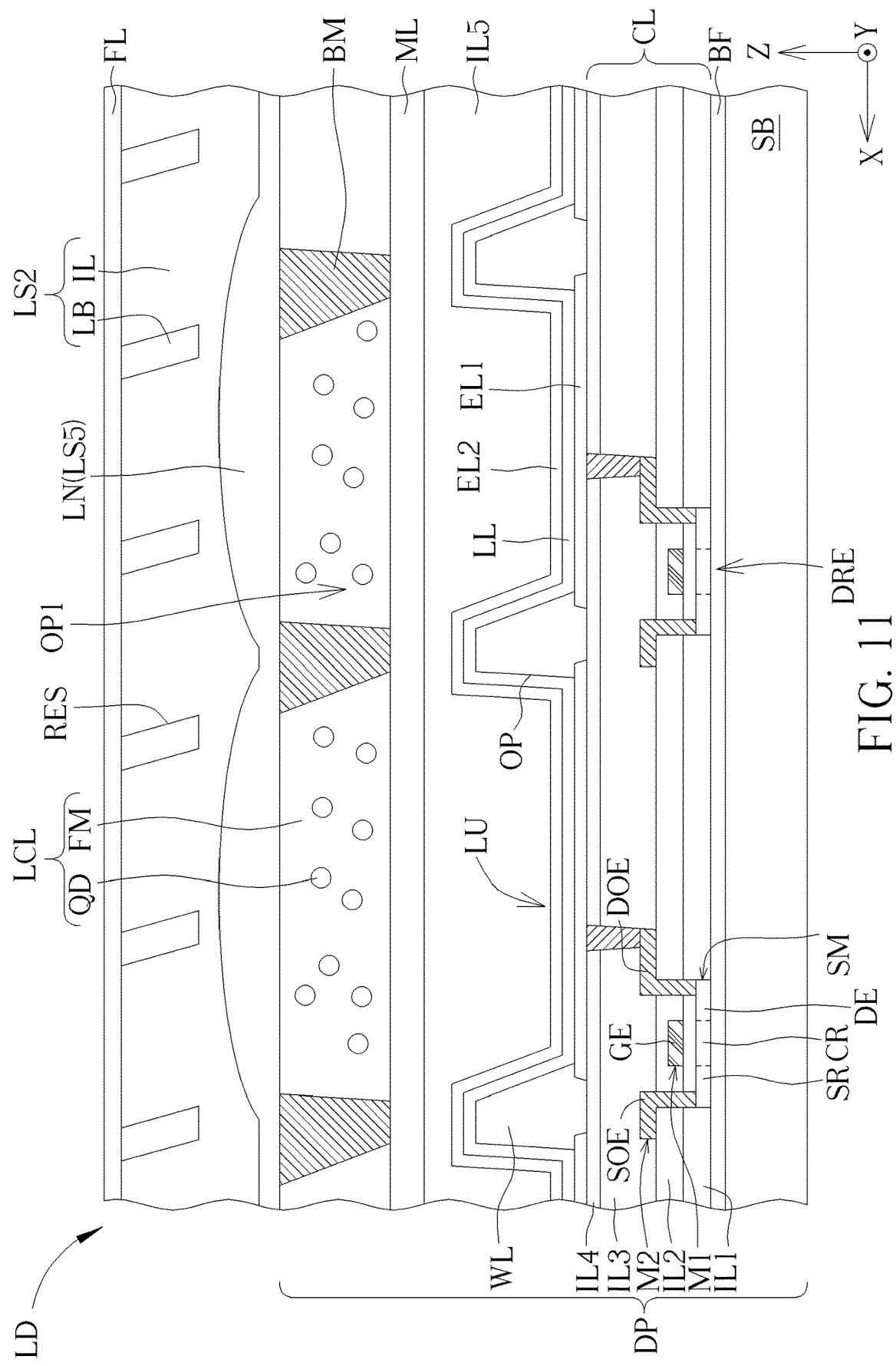
FIG. 11 schematically illustrates a cross-sectional view of an electronic device according to a fourth embodiment of the present disclosure.

Referring to FIG. 11, FIG. 11 schematically illustrates a cross-sectional view of an electronic device according to a fourth embodiment of the present disclosure. In the present embodiment, the light emitting unit LU of the display panel DP may include organic light emitting diode, thereby including a first electrode EL1, a second electrode EL2 and a light emitting layer LL disposed between the first electrode EL1 and the second electrode EL2. The first electrode EL1 may be disposed under the wall structures WL, a portion of the first electrode EL1 may be exposed by the opening OP (that is, not overlapped with the wall structures WL), the light emitting layer LL may be disposed on the first electrode EL1 and the wall structures WL, and the second electrode EL2 may be disposed on the light emitting layer LL, but not limited thereto. Therefore, the range of the light emitting unit LU may be the range of the opening OP of the wall structures WL. In addition, the display panel DP may further include a light converting layer LCL and a black matrix layer BM disposed on the light emitting units LU, wherein the black matrix layer BM may include a plurality of openings OP1, and the light converting layer LCL may be disposed in the openings OP1 of the black matrix layer BM and correspond to the light emitting units LU. The intermediate layer ML may be disposed between the light converting layer LCL and the light emitting units LU, but not limited thereto. The light converting layer LCL may include a filling material FM and light converting particles QD dispersed in the filling material FM, wherein the light converting particles QD may for example include quantum dots, but not limited thereto. In some embodiments, a portion of the light converting layer LCL may include the filling material FM but not include the light converting particle QD.

In some embodiments, the wall structures WL may serve as the light adjustment structure LS1. The structural features of the light adjustment structure LS1 may refer to the contents mentioned above, and will not be redundantly described. In some embodiments, the shape of the black matrix layer BM may be adjusted to make the black matrix layer BM as a light adjustment structure, such that the openings OP1 and the openings OP may be tilted toward the same direction, thereby achieving the effect of adjusting the light path of the output light. For example, the cross-sectional shape of the black matrix layer BM may be obtained by rotating the cross-sectional shape of the wall structure WL by 180 degrees, but not limited thereto.

In some embodiments, the light emitting device LD may include a lens LN disposed on the light converting layer LCL. The light emitted from the light emitting units LU may be refracted after passing through the lens LN, such that the light path thereof may be changed. Therefore, the lens LN may serve as a light adjustment structure LS5 of the light emitting device LD.

In some embodiments, the light emitting device LD may include the light adjustment structure LS2 disposed on the light converting layer LCL. As shown in FIG. 11, the light adjustment structure LS2 of the present embodiment may include the insulating layer IL and the light blocking elements LB, and the light adjustment structure LS2 may be formed in the following way. First, the insulating layer IL may be disposed on the light converting layer LCL, and a plurality of recesses RES may be formed on the surface of the insulating layer IL. After that, the material having rotation light shielding property may be filled into the recesses RES to form the light blocking elements LB. The structural features of the light blocking elements LB may refer to the contents mentioned above, and will not be redundantly described.

It should be noted that the light emitting device LD of the present embodiment is not limited to what is shown in FIG. 11. In some embodiments, the light emitting device LD may include one or more of the above-mentioned light adjustment structures. In addition, the light emitting device LD of the present embodiment may further include a functional layer FL disposed on the light adjustment structure LS2. The functional layer FL may for example serve as an encapsulation layer or a protecting layer, but not limited thereto.

Figure 12:
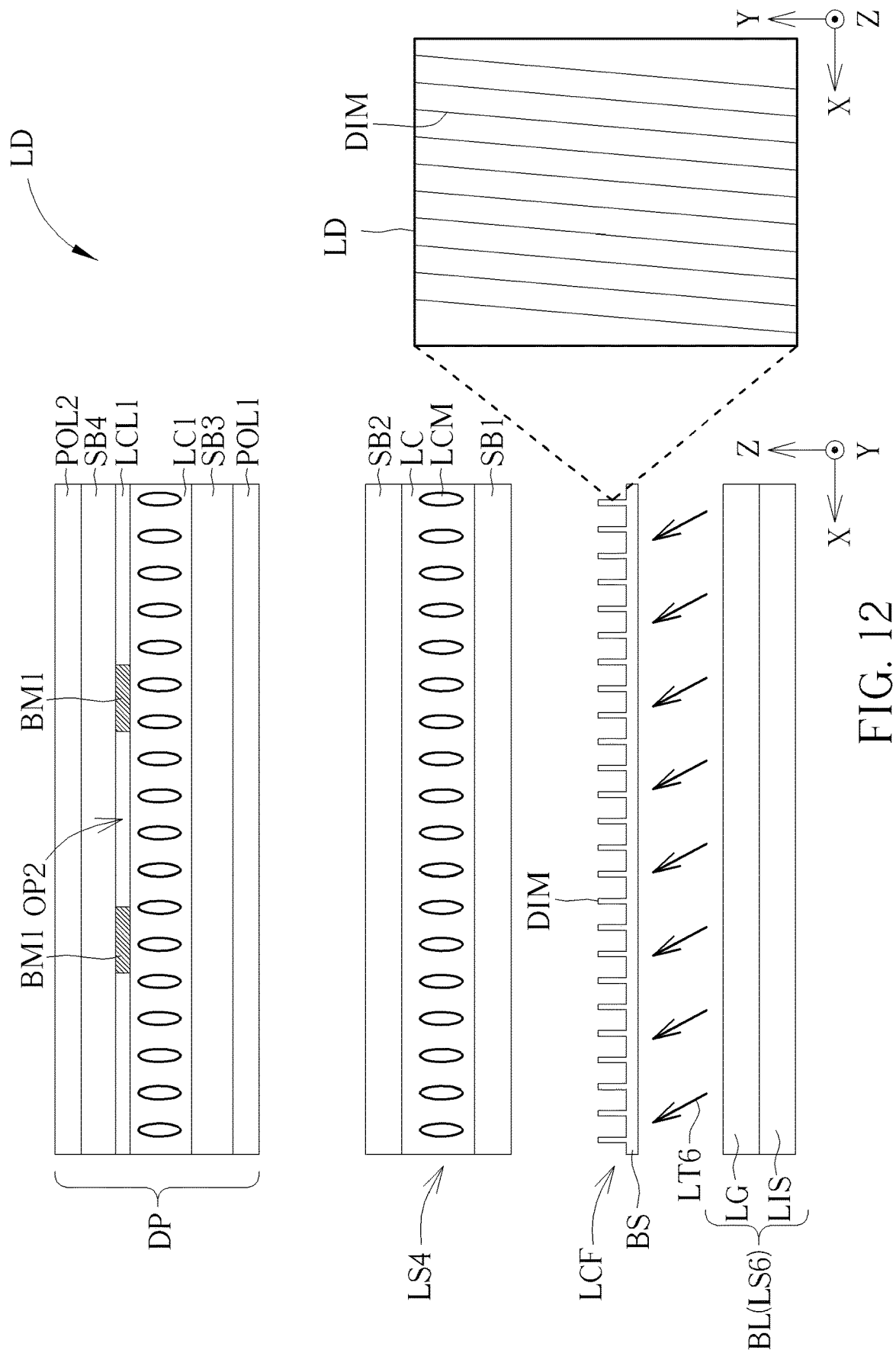
FIG. 12 schematically illustrates an exploded view of an electronic device according to a fifth embodiment of the present disclosure.

Referring to FIG. 12, FIG. 12 schematically illustrates an exploded view of an electronic device according to a fifth embodiment of the present disclosure. The display panel DP of the light emitting device LD of the present embodiment may include a liquid crystal display panel. Therefore, the light emitting device LD may include a backlight module BL and the display panel DP disposed on the backlight module BL. The display panel DP may include a substrate SB3, a substrate SB4 and a liquid crystal layer LC1 disposed between the substrate SB3 and the substrate SB4. In some embodiments, the display panel DP may further include a black matrix layer BM1 and a light converting layer LCL1 disposed at the side of the substrate SB4 facing the substrate SB3, wherein the black matrix layer BM1 may include a plurality of openings OP2, and the light converting layer LCL1 may be disposed in the openings OP2. In some embodiments, the display panel DP may further include a polarizer POL1 disposed at a side of the substrate SB3 away from the substrate SB4 and a polarizer POL2 disposed at a side of the substrate SB4 away from the substrate SB3. It should be noted that FIG. 12 just simply shows the structure of the display panel DP, and the display panel DP may include other suitable elements and/or layers. In addition, the stacking relationship of the layers of the display panel DP is not limited to what is shown in FIG. 12. The backlight module BL may include a light source LIS and a light guide plate LG disposed on the light source LIS. The light source LIS may include any suitable light emitting unit, such as light emitting diodes, but not limited thereto. In addition, the light emitting device LD may further include a light controlling film LCF disposed between the backlight module BL and the display panel DP, wherein the light emitted by the backlight module BL may pass through the light controlling film LCF before entering the display panel DP. The light controlling film LCF may include a base BS and a plurality of directional elements DIM disposed on the surface of the base BS, but not limited thereto. The light controlling film LCF may control the traveling direction of the light emitted by the backlight module BL through the extending direction of the directional elements DIM. In the present embodiment, the extending direction of the directional elements DIM away from the base BS may be parallel to the direction Z, or in other words, the directional elements DIM may be perpendicular to the surface of the base BS, but not limited thereto. The directional elements DIM of the present embodiment may be string-shaped, but not limited thereto.

In some embodiments, the light emitting device LD may further include the light adjustment structure LS4 disposed between the backlight module BL and the display panel DP. In order to simplify the figure, FIG. 12 just shows the substrate SB1, the substrate SB2 and the liquid crystal layer LC disposed between the substrate SB1 and the substrate SB2 of the light adjustment structure LS4, and the detailed structure of the light adjustment structure LS4 may refer to FIG. 10 and related contents mentioned above.

In some embodiments, the backlight module BL may serve as a light adjustment structure LS6. Specifically, a light (such as the light LT6) emitted from the backlight module BL may be altered toward the direction X, such that the luminance of the first region IFR may be reduced (as shown in FIG. 1). In some embodiments, the effect of changing the light path may be achieved by making the light emitting units disposed in the light source LIS tilt (for example, tilt toward the direction X) or disposing the light emitting units of the light source LIS on an inclined surface. In some embodiment, the light guide plate LG may be designed, such that the light may travel in different directions before and after entering the light guide plate LG, thereby achieving the effect of changing the light path. In some embodiments, the light emitting units of the backlight module BL may be divided into two portions respectively emit different types of light. For example, the two portions of the light emitting units of the backlight module BL may respectively emit the light with narrow angle of view and the light with wide angle of view, but not limited thereto. In some other embodiments, the light emitting units of the backlight module BL may be divided into two portions, and the lights respectively emitted by the two portions of the light emitting units may have the maximum luminance in different directions. Accordingly, the direction of the light emitted by the backlight module BL may be controlled through any suitable way.

In some embodiments, the light emitting device LD may include the light adjustment structure LS4 and the light adjustment structure LS6. "The light emitting device LD includes the light adjustment structure LS6" mentioned above may represent that the backlight module BL of the light emitting device LD is capable of emitting light with narrow angle of view or wide angle of view. In some embodiments, the light emitting device LD may include one of the light adjustment structure LS4 and the light adjustment structure LS6.

As shown in FIG. 12, the arranging direction of the directional elements DIM of the light controlling film LCF of the present embodiment is not parallel to the direction Y in the top view direction of the light emitting device LD. That is, the arranging direction of the directional elements DIM may be altered from the direction Y. Accordingly, the arranging direction of the directional elements DIM may not be parallel to the arranging direction of the opaque elements (such as the opaque elements OPE shown in FIG. 8) of the light emitting device LD, thereby reducing the possibility of occurrence of moiré pattern.

Figure 13:
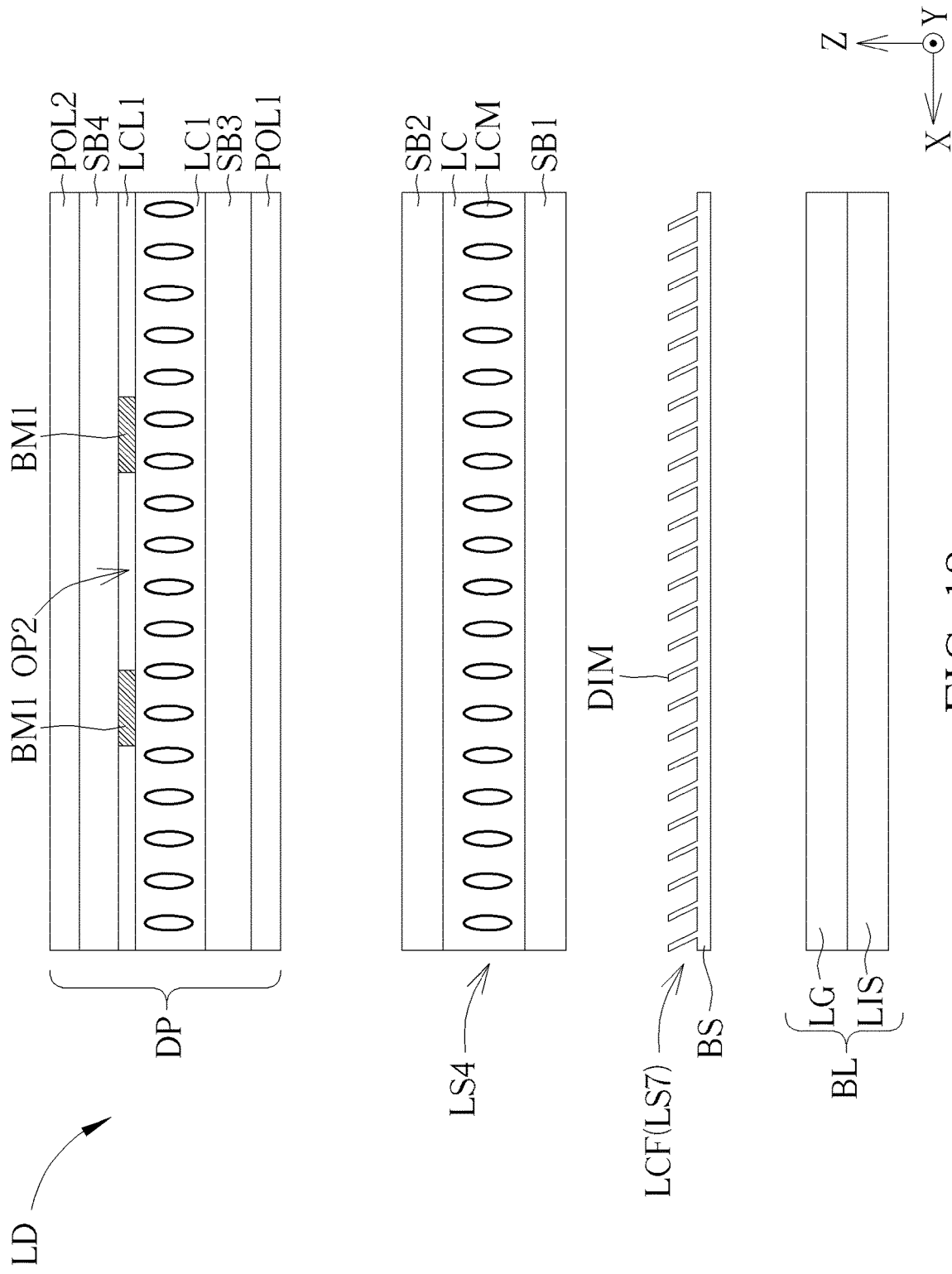
FIG. 13 schematically illustrates an exploded view of an electronic device according to a sixth embodiment of the present disclosure.

Referring to FIG. 13, FIG. 13 schematically illustrates an exploded view of an electronic device according to a sixth embodiment of the present disclosure. According to the present embodiment, the extending direction of the directional elements DIM of the light controlling film LCF may be altered from the direction Z, that is, the extending direction of the directional elements DIM may not be perpendicular to the surface of the base BS. Accordingly, the light may be altered after passing through the light controlling film LCF, thereby achieving the effect of adjusting the light path. In other words, the light controlling film LCF of the present embodiment may serve as a light adjustment structure LS7. The structural features of the display panel DP, the light adjustment structure LS4 and the backlight module BL shown in FIG. 13 may refer to the above-mentioned contents, and will not be redundantly described.

In some embodiments, the backlight module BL of the light emitting device LD may serve as the light adjustment structure LS6 (as shown in FIG. 12), and the light emitting device LD may include the light adjustment structure LS4, the light adjustment structure LS6 and the light adjustment structure LS7. In some embodiments, the light emitting device LD may include one or two of the light adjustment structure LS4, the light adjustment structure LS6 and the light adjustment structure LS7.

In summary, a light emitting device including a light adjustment structure is provided by the present disclosure. The light path of the light emitted by the light emitting device may be adjusted by the light adjustment structure, such that the luminance of the light observed at the specific angle of view may be reduced. Therefore, when the light emitting device is applied to transportation, the effect of the light emitting device on the specific user (such as the driver) may be reduced, thereby reducing the risk of driving the transportation.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A light emitting device configured to emit an output light having a distribution of luminance, comprising:
   a light adjustment structure,
   wherein the output light is adjusted by the light adjustment structure, a sub light is defined as the output light corresponding to an azimuth angle, a first value L1 is a sum of a luminance of the sub light corresponding to a polar angle from 115 degrees to 125 degrees, a second value L2 is a sum of a luminance of the sub light corresponding to a polar angle from 95 degrees to 105 degrees, a third value L3 is a sum of a luminance of the sub light corresponding to a polar angle from 75 degrees to 85 degrees, a fourth value L4 is a sum of a luminance of the sub light corresponding to a polar angle from 55 degrees to 65 degrees, and the first value L1, the second value L2, the third value L3 and the fourth value L4 satisfy following relations:

$$L3 < L2; \text{ and}$$

$$1.23 \leq (L1 * L3)/(L2 * L4) \leq 2.92.$$

2. The light emitting device as claimed in claim 1, wherein the first value L1, the second value L2, the third value L3 and the fourth value L4 satisfy following relation:

$$1.38 \leq (L1*L3)/(L2*L4) \leq 2.67.$$

3. The light emitting device as claimed in claim 1, wherein the first value L1, the second value L2, the third value L3 and the fourth value L4 satisfy following relation:

$$1.23 \leq (L1*L3)/(L2*L4) \leq 2.00.$$

4. The light emitting device as claimed in claim 1, wherein a maximum luminance of the sub light is corresponding to a maximum luminance polar angle, and the maximum luminance polar angle is greater than or equal to 91 degrees and less than or equal to 105 degrees.

5. The light emitting device as claimed in claim 4, wherein the maximum luminance polar angle is greater than or equal to 92 degrees and less than or equal to 100 degrees.

6. The light emitting device as claimed in claim 1, wherein a direction of the azimuth angle is parallel to a horizontal axis of the light emitting device.

7. A light emitting device configured to emit an output light having a distribution of luminance, comprising:
a light adjustment structure,
wherein the output light is adjusted by the light adjustment structure, a sub light is defined as the output light corresponding to an azimuth angle, a first value L1 is a sum of a luminance of the sub light corresponding to a polar angle from 125 degrees to 135 degrees, a second value L2 is a sum of a luminance of the sub light corresponding to a polar angle from 95 degrees to 105 degrees, a third value L3 is a sum of a luminance of the sub light corresponding to a polar angle from 75 degrees to 85 degrees, a fourth value L4 is a sum of a luminance of the sub light corresponding to a polar angle from 45 degrees to 55 degrees, and the first value L1, the second value L2, the third value L3 and the fourth value L4 satisfy the following relations:

$$L3 < L2; \text{ and}$$

$$1.1 \leq (L2*L4)/(L1*L3).$$

8. The light emitting device as claimed in claim 7, wherein the first value L1, the second value L2, the third value L3 and the fourth value L4 satisfy following relation:

$$1.3 \leq (L2*L4)/(L1*L3).$$

9. The light emitting device as claimed in claim 7, wherein the first value L1, the second value L2, the third value L3 and the fourth value L4 satisfy following relation:

$$1.3 \leq (L2*L4)/(L1*L3) \leq 100.$$

10. The light emitting device as claimed in claim 7, wherein a maximum luminance of the sub light is corresponding to a maximum luminance polar angle, and the maximum luminance polar angle is greater than or equal to 91 degrees and less than or equal to 105 degrees.

11. The light emitting device as claimed in claim 10, wherein the maximum luminance polar angle is greater than or equal to 92 degrees and less than or equal to 100 degrees.

12. The light emitting device as claimed in claim 7, wherein a direction of the azimuth angle is parallel to a horizontal axis of the light emitting device.

13. A light emitting device disposed in front of a front seat of a vehicle and emitting an output light having a distribution of luminance, comprising:
a light adjustment structure,
wherein the output light is adjusted by the light adjustment structure, a sub light is defined as the output light corresponding to an azimuth angle, a maximum luminance of the sub light is corresponding to a maximum luminance polar angle, and the maximum luminance polar angle is greater than or equal to 91 degrees and less than or equal to 105 degrees, wherein the azimuth angle is 180 degrees for a left-hand drive vehicle, and the azimuth angle is 0 degree for a right-hand drive vehicle,
wherein a first value L1 is a sum of a luminance of the sub light corresponding to a polar angle from 125 degrees to 135 degrees, a second value L2 is a sum of a luminance of the sub light corresponding to a polar angle from 95 degrees to 105 degrees, a third value L3 is a sum of a luminance of the sub light corresponding to a polar angle from 75degrees to 85 degrees, a fourth value L4 is a sum of a luminance of the sub light corresponding to a polar angle from 45 degrees to 55 degrees, and the first value L1, the second value L2, the third value L3 and the fourth value L4 satisfy following relations:

$$L3 < L2; \text{ and}$$

$$1.1 \leq (L2*L4)/(L1*L3).$$

14. The light emitting device as claimed in claim 13, wherein the maximum luminance polar angle is greater than or equal to 92 degrees and less than or equal to 100 degrees.

15. The light emitting device as claimed in claim 13, wherein the first value L1, the second value L2, the third value L3 and the fourth value L4 satisfy following relation:

$$1.3 \leq (L2*L4)/(L1*L3).$$

16. The light emitting device as claimed in claim 13, wherein the first value L1, the second value L2, the third value L3 and the fourth value L4 satisfy following relation:

$$1.3 \leq (L2*L4)/(L1*L3) \leq 100.$$

* * * * *